United States Patent [19]
Matsumoto et al.

[11] Patent Number: 6,032,382
[45] Date of Patent: Mar. 7, 2000

[54] DRYING APPARATUS AND METHOD USING IPA OF A SEMICONDUCTOR WAFER

[75] Inventors: Akinori Matsumoto; Takeshi Kuroda, both of Hyogo; Cozy Ban, Tokyo; Toko Konishi, Tokyo; Naoki Yokoi, Tokyo, all of Japan

[73] Assignees: Mitsubishi Denki Kabushiki Kaisha, Tokyo; Ryoden Semiconductor System Engineering Corporation, Itami, both of Japan

[21] Appl. No.: 08/969,201

[22] Filed: Nov. 12, 1997

[30] Foreign Application Priority Data

May 22, 1997 [JP] Japan .................................. 9-132046

[51] Int. Cl.[7] .................................................. F26B 21/06
[52] U.S. Cl. .......................................................... 34/78
[58] Field of Search ............................. 34/467, 468, 469, 34/470, 473, 73, 74, 76, 77, 78; 134/61, 107, 108, 902

[56] References Cited

U.S. PATENT DOCUMENTS

| | | | |
|---|---|---|---|
| 4,777,970 | 10/1988 | Kusuhara | 34/78 X |
| 5,183,067 | 2/1993 | Slinn . | |
| 5,369,891 | 12/1994 | Kamikawa . | |
| 5,443,540 | 8/1995 | Kamikawa | 34/471 |
| 5,535,525 | 7/1996 | Gardner . | |
| 5,539,995 | 7/1996 | Bran | 34/77 |
| 5,608,974 | 3/1997 | Tanaka et al. | 34/78 |
| 5,657,553 | 8/1997 | Tarui et al. | 34/78 |
| 5,671,544 | 9/1997 | Yokomizo et al. | 34/78 |
| 5,716,458 | 2/1998 | Machino | 134/42 |

FOREIGN PATENT DOCUMENTS

| | | |
|---|---|---|
| 61-241927 | 10/1986 | Japan . |
| 3-70134 | 3/1991 | Japan . |
| 4-79223 | 3/1992 | Japan . |
| 6-77203 | 3/1994 | Japan . |

*Primary Examiner*—Henry Bennett
*Assistant Examiner*—Steve Gravini
*Attorney, Agent, or Firm*—Oblon, Spivak, McClelland, Maier & Neustadt, P.C.

[57] ABSTRACT

When an IPA is fed to a nozzle, a flow of the IPA passing through holes is generated. The flow becomes film-shaped and goes downward along an inner surface of a side wall of a processing vessel. Then, the flow is collected by a liquid receiving section formed in a lower portion of the processing vessel and discharged to an outside. The inner surface of the side wall of the processing vessel is covered with the flow of the IPA. Therefore, an IPA vapor can be prevented from condensing uselessly on the inner surface. As a result, the IPA vapor is effectively utilized for condensation on a surface of the object to be processed which is mounted on a pan. Thus, the defective dryness of the object can be prevented.

15 Claims, 27 Drawing Sheets

F I G . 6
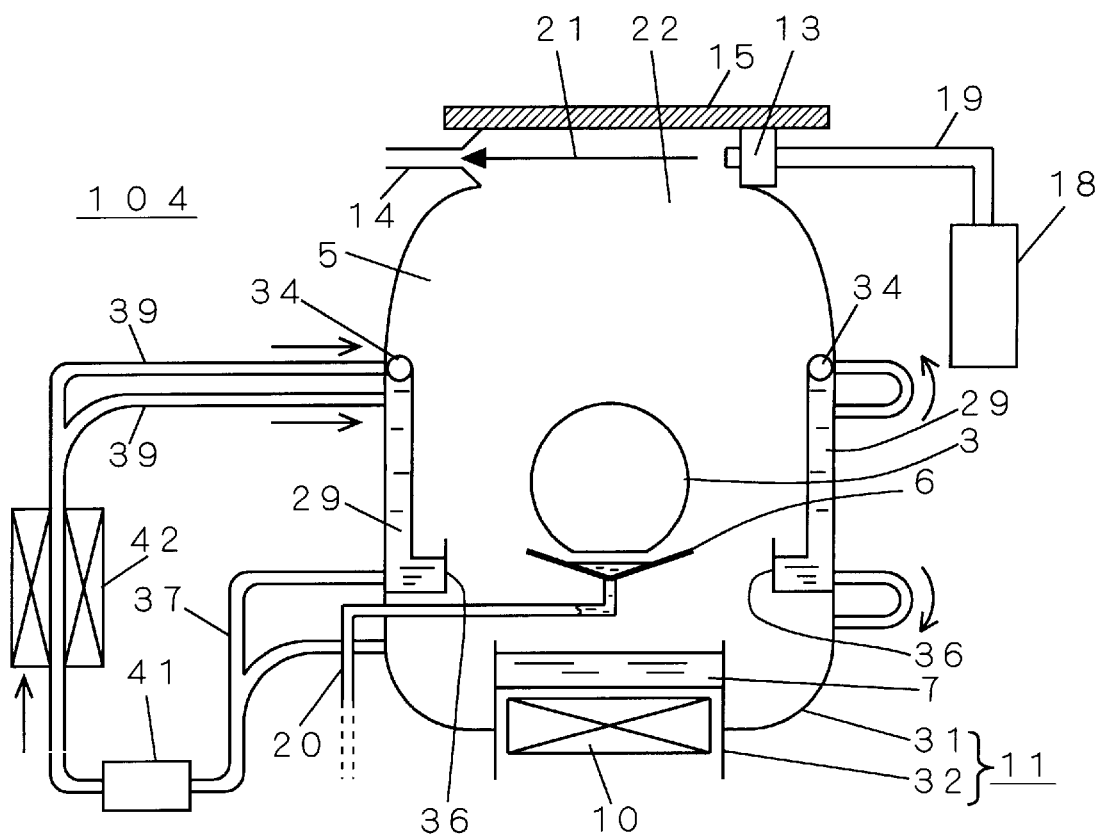

F I G . 7
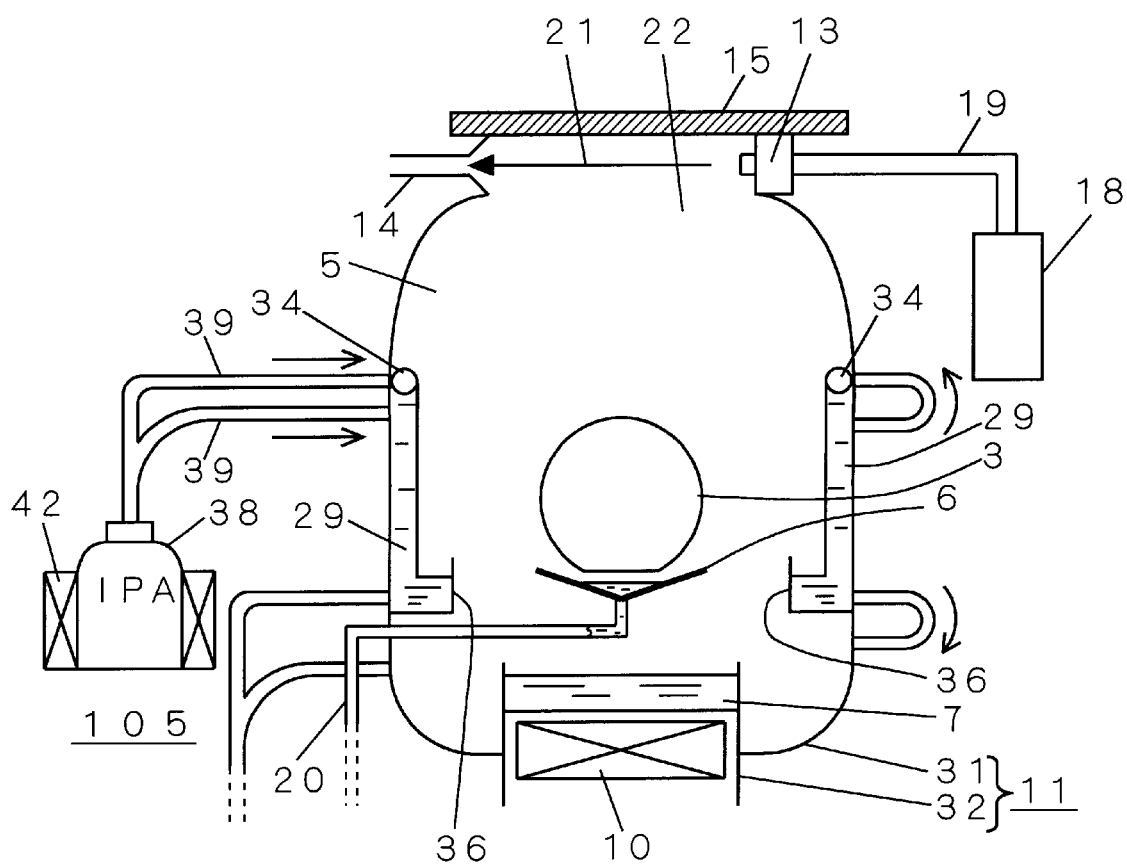

DRYING APPARATUS AND METHOD USING IPA OF A SEMICONDUCTOR WAFER

BACKGROUND OF THE INVENTION

1. Field of the Invention

The present invention relates to a drying technique suitable for drying a semiconductor wafer, and more particularly to improvement to prevent defective dryness.

2. Description of the Background Art

FIG. 27 is a front sectional view showing a structure of a drying apparatus according to the prior art which is the background of the present invention. A drying apparatus 151 is formed to dry a semiconductor wafer. The drying apparatus 151 comprises a processing vessel 171 having an upper end opened. A cooling coil 162 is attached to an inside of an upper portion of a side wall of the processing vessel 171 along the side wall of the processing vessel 171. The cooling coil 162 is formed of a silica tube, in which cooling water is caused to flow.

A heater 170 is provided just below a bottom portion of the processing vessel 171. Furthermore, a pan 166 is fixed to a position between the bottom portion and an upper open end in the processing vessel 171. A pipe 180 for drain is connected to a bottom portion of the pan 166.

When the drying apparatus 151 is used, an IPA (isopropyl alcohol) 167 is first poured into the processing vessel 171. A depth of the processing vessel 171 is regulated in such a manner that a liquid level does not reach the bottom portion of the pan 166. The cooling water is caused to flow in the cooling coil 162.

When the heater 170 is turned on, the IPA 167 is heated. As a result, the IPA 167 is vaporized so that an IPA vapor 165 is generated. The IPA vapor 165 is filled into the processing vessel 171. The IPA vapor 165 is cooled and condenses in the vicinity of the cooling coil 162. More specifically, the cooling coil 162 serves to prevent the IPA vapor 165 from leaking out of the processing vessel 171.

Accordingly, the IPA 167 is stored in a liquid storing section 169 provided in the vicinity of the bottom portion of the processing vessel 171, and the IPA vapor 165 is filled into a vapor filling section 168 from a top of the IPA 167 to the vicinity of the cooling coil 162. After the IPA vapor 165 is filled into the vapor filling section 168, a processing is started for a semiconductor wafer 163 to be processed. After a rinsing processing is completed, a lot of semiconductor wafers 163 and a cassette 164 carrying them are suspended from a holding arm 161 and are inserted into the vapor filling section 168 from above the processing vessel 171. The cassette 164 carrying the semiconductor wafers 163 is held by the holding arm 161 just above the pan 166 as shown in FIG. 27.

Consequently, the IPA vapor 165 filled in the vapor filling section 168 condenses and dissolves into waterdrops which stick to surfaces of the semiconductor wafers 163 and the cassette 164. As a result, the waterdrops are essentially changed into IPA droplets. The IPA droplets slip from the surfaces of the semiconductor wafers 163 and the cassette 164. Thus, the semiconductor wafers 163 and the cassette 164 which are wet with the waterdrops can be dried. The slipping IPA droplets are collected by the pan 166 and are then discharged to an outside through the pipe 180.

When the drying processing is completed, the cassette 164 is pulled up by the holding arm 161 and is taken out of the processing vessel 171. Then, the cassette 164 thus taken out is delivered to a next processing step. Thereafter, new (i.e. unprocessed) semiconductor wafers 163 and a new cassette 164 are put into the processing vessel 171. Thus, the semiconductor wafers 163 and the cassette 164 are dried repeatedly.

In the drying apparatus 151 according to the prior art, however, the semiconductor wafers 163 to be processed are exposed to the IPA vapor 165, and the IPA vapor 165 is caused to condense on the surfaces of the semiconductor wafers 163 so that the surfaces can be dried. Under conditions that an amount of condensation of the IPA vapor 165 is insufficient, the drying processing is not fully performed so that defective dryness is caused.

In particular, the IPA vapor 165 condenses in unnecessary portions such as a surface of an internal wall of the processing vessel 171 as well as the semiconductor wafers 163 acting as objects to be processed which have been put in. Therefore, the amount of condensation of the IPA vapor 165 is insufficient in some cases. Thus, yield of a semiconductor device manufactured in the semiconductor wafer 163 is deteriorated by the defective dryness of the semiconductor wafer 163.

SUMMARY OF THE INVENTION

A first aspect of the present invention is directed to a drying apparatus for drying a surface of an object to be processed by using a water-soluble solvent, comprising a processing vessel defining, on a top, an upward opening through which the object can be put in and out, and capable of storing the solvent in a bottom portion and of housing the object above the stored solvent.

The drying apparatus further comprises heating means capable of heating the solvent stored in the bottom portion of the processing vessel, diffusion preventing means for preventing a vapor generated by heating the stored solvent from diffusing from an inside of the processing vessel to an outside thereof through the opening, a nozzle for generating a flow of the solvent to cover an inner surface of a side wall of the processing vessel along the inner surface on receipt of a supply of the solvent, and liquid collecting means for collecting the solvent which has flown along the inner surface and leading the solvent to the outside of the processing vessel.

A second aspect of the present invention is directed to the drying apparatus according to the first aspect of the present invention, further comprising circulating means for returning the solvent collected by the liquid collecting means to the nozzle again, thereby cyclically feeding the solvent to the nozzle.

A third aspect of the present invention is directed to the drying apparatus according to the first or second aspect of the present invention, further comprising a heater fixed to an outer surface of the side wall of the processing vessel for heating the flow of the solvent.

A fourth aspect of the present invention is directed to the drying apparatus according to any of the first to third aspects of the present invention, wherein the circulating means includes a heating device for heating the solvent collected by the liquid collecting means before the solvent is returned to the nozzle.

A fifth aspect of the present invention is directed to a drying apparatus for drying a surface of an object to be processed by using a water-soluble solvent, comprising a processing vessel defining, on a top, an upward opening through which the object can be put in and out, and capable of storing the solvent in a bottom portion, of immersing the object in the stored solvent, and of housing the object above the stored solvent.

The drying apparatus further comprises heating means capable of heating the solvent stored in the bottom portion of the processing vessel, and diffusion preventing means for preventing a vapor generated by heating the stored solvent from diffusing from an inside of the processing vessel to an outside thereof through the opening.

A sixth aspect of the present invention is directed to the drying apparatus according to the fifth aspect of the present invention, further comprising reprocessing means for collecting the solvent stored in the bottom portion of the processing vessel, removing water from the collected solvent and returning the solvent to the processing vessel again, thereby cyclically reprocessing the stored solvent.

A seventh aspect of the present invention is directed to the drying apparatus according to the sixth aspect of the present invention, wherein the reprocessing means includes separating means for removing the water from the solvent by a separation film for separating the water from the solvent.

An eighth aspect of the present invention is directed to the drying apparatus according to the sixth aspect of the present invention, wherein the reprocessing means includes distilling means for distilling the collected solvent to remove the water from the solvent.

A ninth aspect of the present invention is directed to the drying apparatus according to any of the fifth to eighth aspects of the present invention, wherein the diffusion preventing means includes spouting means and exhaust means provided opposite to each other with the opening interposed therebetween. The exhaust means defines an exhaust port for opening toward the spouting means, the spouting means can generate a jet of a gas going toward the exhaust port and covering the opening on receipt of a supply of the gas, the exhaust means can discharge, to an outside, the gas sucked through the exhaust port, and a side wall of the processing vessel has a curved portion which is smoothly curved inward as the opening is approached upward.

The drying apparatus further comprises a pipe connected to the spouting means, nonreactive gas feeding means connected to the spouting means through the pipe for feeding a nonreactive gas to the spouting means, and cooling means provided on at least a part of the pipe for cooling the nonreactive gas flowing through the pipe.

A tenth aspect of the present invention is directed to the drying apparatus according to any of the fifth to eighth aspects of the present invention, wherein the diffusion preventing means includes spouting means and exhaust means provided opposite to each other with the opening interposed therebetween. The exhaust means defines an exhaust port for opening toward the spouting means, the spouting means can generate a jet of a gas going toward the exhaust port and covering the opening on receipt of a supply of the gas, the exhaust means can discharge, to an outside, the gas sucked through the exhaust port, and a side wall of the processing vessel has a curved portion which is smoothly curved inward as the opening is approached upward.

The drying apparatus further comprises a switching valve having an output coupled to the spouting means for freely selecting one of inputs to communicate with the output, ordinary temperature gas feeding means for feeding a nonreactive gas having an ordinary temperature, cooled gas feeding means for feeding a cooled nonreactive gas, and control means for controlling switching operation of the switching valve.

The ordinary temperature gas feeding means is connected to one of the inputs, the cooled gas feeding means is connected to another input, and the control means controls the switching valve such that the jet is changed into a jet of the cooled nonreactive gas only when the object is put into the processing vessel across the jet generated by the spouting means.

An eleventh aspect of the present invention is directed to the drying apparatus according to any of the fifth to eighth aspects of the present invention, further comprising cooling means for cooling air above the opening of the processing vessel.

A twelfth aspect of the present invention is directed to the drying apparatus according to any of the fifth to eighth aspects of the present invention, wherein the diffusion preventing means includes cooling means provided in a portion of the processing vessel close to the opening for cooling an inside of the processing vessel in the vicinity of the opening such that the object which is put into the processing vessel through the opening can be cooled.

A thirteenth aspect of the present invention is directed to the drying apparatus according to any of the fifth to eighth aspects of the present invention, further comprising cooling and rinsing means provided adjacently to the processing vessel, the cooling and rinsing means including a rinsing vessel defining, on a top, an upward opening through which the object can be put in and out, and capable of storing rinsing water and of immersing the object in the stored rinsing water, and cooling means fixed to the rinsing vessel for cooling the rinsing water.

A fourteenth aspect of the present invention is directed to a drying apparatus for drying a surface of an object to be processed by using a water-soluble solvent, comprising a processing vessel defining, on a top, an upward opening through which the object can be put in and out, and capable of storing the solvent in a bottom portion and of housing the object above the stored solvent.

The drying apparatus further comprises heating means capable of heating the solvent stored in the bottom portion of the processing vessel, diffusion preventing means for preventing a vapor generated by heating the stored solvent from diffusing from an inside of the processing vessel to an outside thereof through the opening, and a nozzle for spouting the solvent like a mist into the processing vessel on receipt of a supply of the solvent.

A fifteenth aspect of the present invention is directed to a drying apparatus for drying a surface of an object to be processed by using a water-soluble solvent, comprising a processing vessel defining, on a top, an upward opening through which the object can be put in and out, and capable of storing the solvent in a bottom portion and of housing the object above the stored solvent.

The drying apparatus further comprises heating means capable of heating the solvent stored in the bottom portion of the processing vessel, diffusion preventing means for preventing a vapor generated by heating the stored solvent from diffusing from an inside of the processing vessel to an outside thereof through the opening, cooling and rinsing means provided adjacently to the processing vessel, and control means for controlling the heating means.

The cooling and rinsing means includes a rinsing vessel defining, on a top, an upward opening through which the object can be put in and out, and capable of storing rinsing water and of immersing the object in the stored rinsing water, and a sensor fixed to the rinsing vessel for detecting presence of the object in the rinsing vessel and for sending a detection signal to the control means.

Furthermore, the control means controls an output of the heating means so as to compensate, in response to the detection signal, for an amount of heat taken away from the vapor filled in the processing vessel by the object which is transferred from the rinsing vessel into the processing vessel in response to the detection signal.

A sixteenth aspect of the present invention is directed to the drying apparatus according to any of the first to eighth aspects or the eleventh to fifteenth aspects of the present invention, wherein the diffusion preventing means includes spouting means and exhaust means provided opposite to each other with the opening interposed therebetween.

The exhaust means defines an exhaust port for opening toward the spouting means, the spouting means can generate a jet of a gas going toward the exhaust port and covering the opening on receipt of a supply of the gas, the exhaust means can discharge, to an outside, the gas sucked through the exhaust port, and the side wall of the processing vessel has a curved portion which is smoothly curved inward as the opening is approached upward.

A seventeenth aspect of the present invention is directed to a method for drying a surface of an object by using a water-soluble solvent, comprising the step of preparing a processing vessel defining, on a top, an upward opening through which the object can be put in and out, and capable of storing the solvent in a bottom portion, of immersing the object in the stored solvent, and of housing the object above the stored solvent.

The drying method further comprises the steps of storing such an amount of the solvent as to immerse the object in the bottom portion of the processing vessel, heating the stored solvent and filling a vapor of the solvent in the processing vessel, inserting the object from an outside into the processing vessel through the opening, and putting down the put object in the filled vapor toward the stored solvent.

The drying method further comprises the steps of immersing the object in the stored solvent, thereby removing water sticking to the surface of the object, pulling up the object from the solvent and exposing the object to the filled vapor, thereby removing the solvent remaining on the surface of the object, and taking the object out of the processing vessel through the opening.

An eighteenth aspect of the present invention is directed to the drying method according to the seventeenth aspect of the present invention, further comprising a step of cooling the object prior to the putting down step.

A nineteenth aspect of the present invention is directed to the drying method according to the seventeenth aspect of the present invention, further comprising a step of immersing the object in cooled rinsing water to perform rinsing prior to the inserting step.

A twentieth aspect of the present invention is directed to a method for drying a surface of an object to be processed by using the drying apparatus according to any of the first to fourth aspects or the fourteenth to sixteenth aspects of the present invention, comprising the steps of preparing the drying apparatus, feeding the solvent into the processing vessel, thereby storing the solvent in a part of the processing vessel, driving the heating means to heat the solvent, and inserting the object into the processing vessel through the opening.

The drying method further comprises the steps of drying the surface of the inserted object by the vapor of the heated solvent while holding the object above a liquid level of the solvent, and taking the object out of the processing vessel through the opening after the drying step.

According to the first aspect of the present invention, the solvent is fed to the nozzle so that the flow of the solvent covering the inner surface of the side wall of the processing vessel can be generated. Consequently, the vapor of the solvent can be prevented from condensing uselessly on the inner surface of the side wall. As a result, an efficiency of condensation of the vapor on the object can be increased and defective dryness can be prevented.

According to the second aspect of the present invention, the solvent is cyclically fed to the nozzle. Consequently, a cost of feeding the solvent can be reduced.

According to the third aspect of the present invention, the solvent flowing from the nozzle is heated by the heater. Consequently, the vapor can be prevented from condensing uselessly into the flowing solvent. Therefore, the vapor is utilized more effectively for condensation on the surface of the object. Accordingly, the defective dryness of the object can be prevented more.

According to the fourth aspect of the present invention, the solvent is previously heated and is then fed to the nozzle. Therefore, a temperature of the solvent has been raised when the solvent flows from the nozzle. Accordingly, the vapor can be prevented more effectively from condensing into the solvent flowing from the nozzle. As a result, the vapor is utilized more effectively for condensation on the surface of the object. Thus, the defective dryness of the object can be prevented still more.

According to the fifth aspect of the present invention, the object is immersed in the solvent stored in the bottom portion of the processing vessel so that waterdrops sticking to the surface are removed, and is then exposed to the vapor filled in the processing vessel so that the remaining solvent is removed. Consequently, the defective dryness is not caused by an insufficient amount of condensation of the vapor which results from a variation in the number of the objects which are put in, a change in the flow of the filled vapor and the like. Consequently, a drying processing can be performed stably.

According to the sixth aspect of the present invention, the solvent into which water is mixed by a processing of drying the object is cyclically reprocessed. Therefore, a concentration of the water in the solvent can be prevented from being increased. Consequently, the processing of drying the object can repeatedly be performed over a long period of time without newly feeding the solvent. As a result, a down time of a device for exchanging the solvent can be shortened. Thus, an efficiency of the drying processing can be enhanced.

According to the seventh aspect of the present invention, the separating means including the separation film is used. Therefore, the solvent can be reprocessed with a simple structure and no energy consumption such as heating.

According to the eighth aspect of the present invention, the distilling means is used. Therefore, the solvent can be reprocessed with a simple structure.

According to the ninth aspect of the present invention, when the object is put from an outside into the processing vessel through the opening, the jet of the nonreactive gas cooled by the cooling means can be generated by the spouting means. More specifically, the object is previously cooled by the jet of the nonreactive gas, then passes through the vapor of the solvent filled in the processing vessel and is immersed in the solvent. When the cooled object passes through the vapor of the solvent, a large amount of the vapor of the solvent uniformly condenses on the surface of the object. As a result, a lot of waterdrops sticking to the surface are previously removed before the object is put into the solvent. Consequently, an excellent drying processing can be performed without causing uneven dryness.

According to the tenth aspect of the present invention, the jet of the cooled nonreactive gas is generated only when the object is put from the outside into the processing vessel across the jet generated by the spouting means. Consequently, an excellent drying processing can be performed and an amount of the cooled nonreactive gas to be used can be reduced so that a cost of performing the processing can be cut down.

According to the eleventh aspect of the present invention, the object passes through the cooled air immediately before it is put from the outside into the processing vessel through the opening. Consequently, the object is previously cooled, then passes through the vapor of the solvent filled in the processing vessel and is immersed in the solvent. When the cooled object passes through the vapor of the solvent, a large amount of the vapor of the solvent uniformly condenses on the surface of the object. Therefore, a lot of waterdrops sticking to the surface are previously removed before the object is put into the solvent. Consequently, an excellent drying processing can be performed without causing uneven dryness.

According to the twelfth aspect of the present invention, the inside in the vicinity of the opening is cooled by the cooling means. Therefore, the vapor of the solvent filled in the processing vessel can be prevented from diffusing to the outside. In addition, the cooling means has a sufficient cooling ability. Consequently, the object is cooled when it is put into the processing vessel through the opening. More specifically, the object is previously cooled, then passes through the vapor of the solvent filled in the processing vessel and is immersed in the solvent. When the cooled object passes through the vapor of the solvent, a large amount of the vapor of the solvent uniformly condenses on the surface of the object. Therefore, a lot of waterdrops sticking to the surface are previously removed before the object is put into the solvent. Consequently, an excellent drying processing can be performed without causing uneven dryness.

According to the thirteenth aspect of the present invention, the object can be put into the processing vessel through the opening after it is immersed at a final step of a rinsing processing in the rinsing water which is stored in the rinsing vessel and cooled by the cooling means. Consequently, the object is previously cooled, then passes through the vapor of the solvent filled in the processing vessel and is immersed in the solvent. When the cooled object passes through the vapor of the solvent, a large amount of the vapor of the solvent uniformly condenses on the surface of the object. Therefore, a lot of waterdrops sticking to the surface are previously removed before the object is put into the solvent. Thus, an excellent drying processing can be performed without causing uneven dryness.

According to the fourteenth aspect of the present invention, the object is exposed to the mist of the solvent spouted from the nozzle when it is put into the processing vessel. As a result, a large amount of the solvent is fed to the surface by the mist of the solvent more quickly than condensation of the vapor of the solvent on the surface of the object. Consequently, an excellent drying processing can be performed without causing uneven dryness. In addition, a time taken for the drying processing can be shortened so that a working efficiency can be enhanced. Furthermore, a temperature of the solvent heated by the heating means can be prevented from being raised high. Thus, safety can be enhanced.

According to the fifteenth aspect of the present invention, the output of the heating means is controlled so as to compensate for the amount of heat taken away from the vapor filled in the processing vessel by the object which is transferred from the rinsing vessel into the processing vessel. Therefore, the temperature and concentration of the vapor of the solvent can be prevented from being lowered by putting the object in. Consequently, defective dryness can be prevented from being caused by temporarily interrupting the drying processing. Thus, an excellent drying processing can be performed without causing uneven dryness. In addition, the time taken for the drying processing can be shortened so that the working efficiency can be enhanced.

According to the sixteenth aspect of the present invention, the nonreactive gas is fed as a gas to the spouting means so that the jet of the nonreactive gas is generated. As a result, a kind of curtain covering the opening of the processing vessel is formed. Furthermore, the side wall of the processing vessel has the curved portion. Consequently, the curtain of the nonreactive gas effectively prevents the vapor generated from the solvent from flowing to the outside. Consequently, the cooling coil which should be used for the drying apparatus according to the prior art is not required. Therefore, a state of the vapor filled in the processing vessel is stabilized. As a result, the defective dryness of the object can be prevented more effectively. Furthermore, an upper portion of the processing vessel necessary for providing the cooling coil is not required. Thus, a size of the apparatus can be reduced. In addition, since the complicated and expensive cooling coil is not required, costs of manufacturing and repairing the apparatus can be reduced and repair work can be performed rapidly.

According to the seventeenth aspect of the present invention, the object is immersed in the solvent stored in the bottom portion of the processing vessel so that waterdrops sticking to the surface are removed, and is then exposed to the vapor filled in the processing vessel so that the remaining solvent is removed. Consequently, the defective dryness is not caused by an insufficient amount of condensation of the vapor which results from a variation in the number of the objects which are put in, a change in the flow of the filled vapor and the like. Consequently, a drying processing can be performed stably.

According to the eighteenth aspect of the present invention, the object is previously cooled, then passes through the vapor of the solvent filled in the processing vessel and is immersed in the solvent. When the cooled object passes through the vapor of the solvent, a large amount of the vapor of the solvent uniformly condenses on the surface of the object. As a result, a lot of waterdrops sticking to the surface are previously removed before the object to be processed is put into the solvent. Consequently, an excellent drying processing can be performed without causing uneven dryness.

According to the nineteenth aspect of the present invention, the object is rinsed and cooled by the cooled rinsing water, then passes through the vapor of the solvent filled in the processing vessel and is immersed in the solvent. When the cooled object passes through the vapor of the solvent, a large amount of the vapor of the solvent uniformly condenses on the surface of the object. Therefore, a lot of waterdrops sticking to the surface are previously removed before the object is put into the solvent. Consequently, an excellent drying processing can be performed without causing uneven dryness.

According to the twentieth aspect of the present invention, the processing of drying the object is performed by using the drying apparatus according to any of the first to fourth aspects or the fourteenth to sixteenth aspects of the present invention. Consequently, the surface of the object receives a supply of a sufficient amount of the solvent at the drying step. As a result, the defective dryness of the object can be prevented so that good results of the processing can be obtained.

Thus, it is an object of the present invention to provide a drying technique capable of preventing defective dryness.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a front sectional view showing an apparatus according to a third embodiment;

FIG. 7 is a front sectional view showing another example of the apparatus according to the third embodiment;

DESCRIPTION OF THE PREFERRED EMBODIMENTS

<1. Introduction>

First of all, a drying apparatus 100 which can act as one of basic techniques according to the following preferred embodiments as well as the drying apparatus 151 according to the prior art will be described below. While the following preferred embodiments will mainly describe examples in which the drying apparatus 100 forms a basis, they can also be executed on the basis of the drying apparatus 151 according to the prior art.

<1-1. Structure of Apparatus 100>

Figure 2:
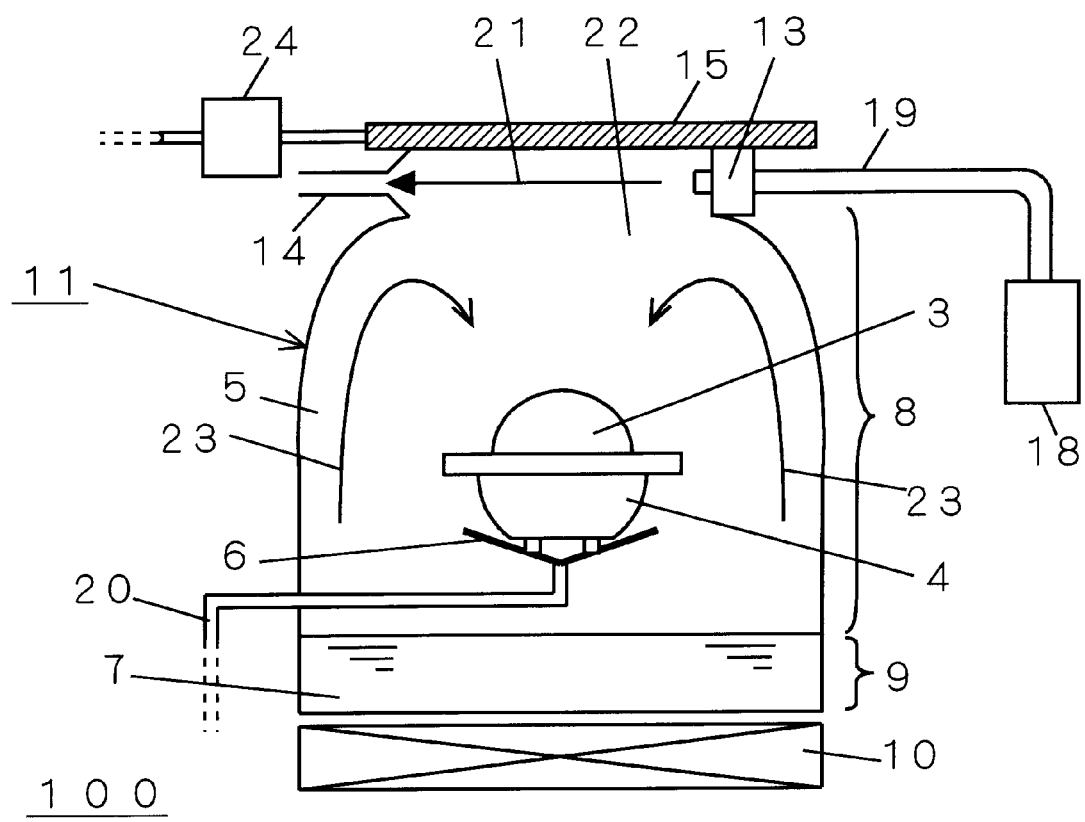
FIG. 2 is a front sectional view showing an apparatus which forms a basis of each preferred embodiment.

FIG. 2 is a front sectional view showing a structure of a drying apparatus 100. The drying apparatus 100 is formed to dry a semiconductor wafer 3 in the same manner as the drying apparatus 151 according to the prior art. As shown in FIG. 2, the drying apparatus 100 comprises a processing vessel 11. The processing vessel 11 is formed as a container having an upper portion opened. In other words, an upward opening 22 is defined in the upper portion of the processing vessel 11. A side wall of the processing vessel 11 is smoothly curved inward in the vicinity of an upper end of the processing vessel 11 as the opening 22 is approached upward.

Nozzles (spouting means) 13 arranged in a line and a duct-shaped exhaust member (exhaust means) 14 are provided opposite to each other in the upper portion of the processing vessel 11 with the opening 22 interposed therebetween. One of ends of a pipe 19 is connected to each nozzle 13. The other end of the pipe 19 is connected to a nitrogen gas feeder 18. For example, the nitrogen gas feeder 18 is provided as one of plants. An exhaust port defined on the exhaust member 14 is opened opposite to the nozzles 13.

Furthermore, a cap 15 for freely covering the opening 22 is provided above the processing vessel 11. In order for the cap 15 to be freely (i.e. removably) put on or taken off, an actuator 24 is coupled to the cap 15 as shown in FIG. 2, for example. The actuator 24 causes the cap 15 to move horizontally in response to a signal sent from a controller (not shown) and to be put on or taken off.

A heater (first heater) 10 is provided just below a bottom portion of the processing vessel 11. Furthermore, a pan 6 is fixed in a position between the bottom portion and the upper opening 22 in the processing vessel 11. One of ends of a pipe 20 for drain is connected to a bottom portion of the pan 6. The pipe 20 penetrates the side wall of the processing vessel 11 and leads to an outside the processing vessel 11.

<1-2. Operation of Apparatus 100>

The drying apparatus 100 is used in the following procedure. First of all, a solvent suitable for drying the rinsed semiconductor wafer 3, for example, an IPA (solvent) 7 is fed into the processing vessel 11. An amount of the IPA 7 to be fed is regulated such that a liquid level is positioned below the bottom portion of the pan 6. The heater 10 is turned on with the cap 15 put on.

As a result, heat generated by the heater 10 is transferred to the IPA 7 through the bottom portion of the processing vessel 11. The IPA 7 is heated so that it is vaporized.

Consequently, an IPA vapor 5 is generated. The IPA vapor 5 is filled into the processing vessel 11. More specifically, the processing vessel 11 is divided into a liquid storing section 9 for storing the IPA 7 and a vapor filling section 8 provided over the liquid storing section 9 for filling the IPA vapor 5.

Before the rinsed semiconductor wafer 3 is put into the processing vessel 11, a nitrogen gas is fed from the nitrogen gas feeder 18 to the nozzles 13 through the pipes 19. Consequently, the nitrogen gas is spouted from the nozzles 13. Since the nozzles 13 are arranged in a line, the spouted nitrogen gas, that is, a jet 21 of the nitrogen gas becomes film-shaped to cover the whole opening 22. The jet 21 is collected by the exhaust port of the exhaust member 14 opened opposite to the nozzles 13. The exhaust member 14 discharges, to the outside, the jet 21 sucked through the exhaust port.

Figure 27:
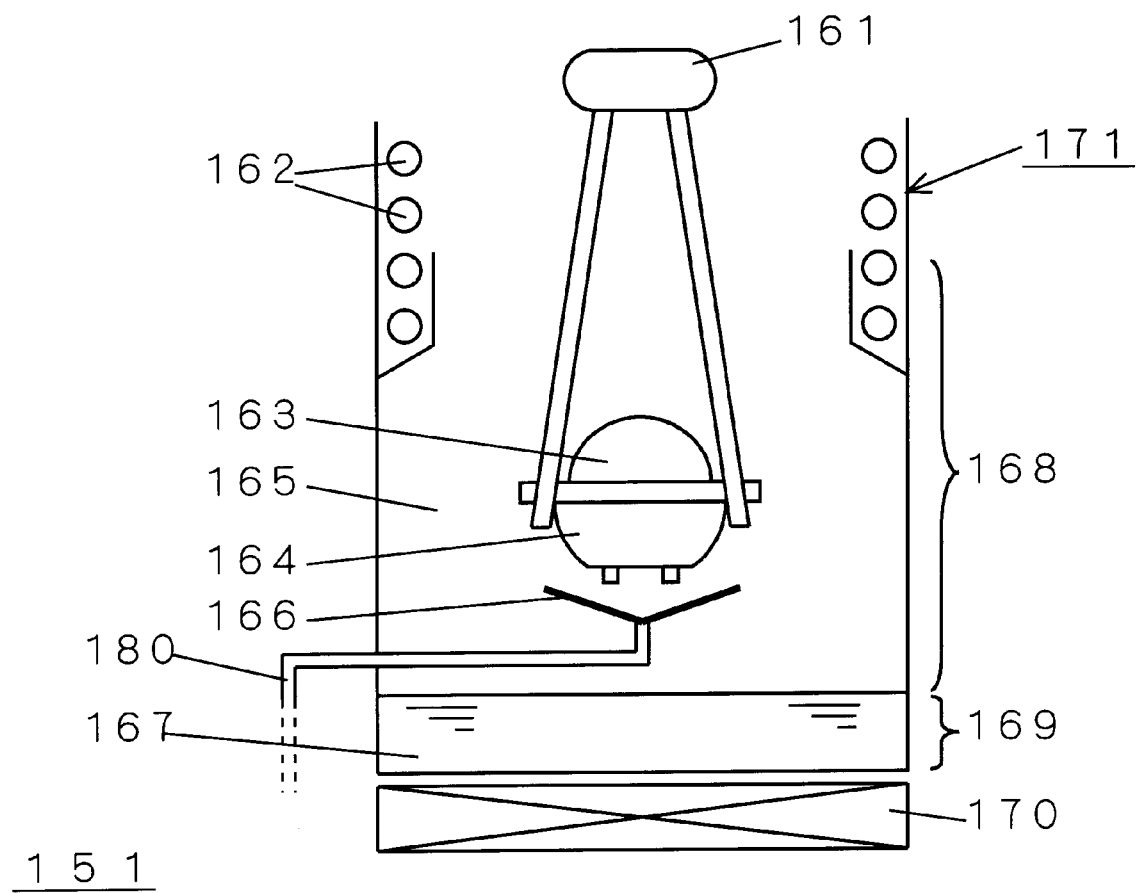
FIG. 27 is a front sectional view showing an apparatus according to the prior art.

While the jet 21 is being spouted, the cap 15 is taken off so that the semiconductor wafer 3 which acts as an object to be processed is put into the processing vessel 11. After a rinsing processing is completed, a lot of semiconductor wafers 3 and a cassette 4 carrying them are suspended from the same holding arm as the holding arm 161 (FIG. 27) and are inserted from above the opening 22 into the vapor filling section 8 through the opening 22 across the jet 21. The cassette 4 carrying the semiconductor wafers 3 is mounted on the pan 6 as shown in FIG. 2. Then, the holding arm is pulled up to the outside. After the holding arm is removed to the outside, the cap 15 can be put on and the jet 21 can be stopped.

The semiconductor wafers 3 and the cassette 4 are held in the vapor filling section 8. Therefore, the IPA vapor 5 filled into the vapor filling section 8 condenses and dissolves into waterdrops which stick to surfaces of the semiconductor wafers 3 and the cassette 4. Since IPA has a high solubility to water, a large amount of the IPA is soluble in the waterdrops. As a result, the waterdrops are essentially changed into IPA droplets so that weights are increased. The IPA droplets slip from the surfaces of the semiconductor wafers 3 and the cassette 4 because of their weights.

Thus, the semiconductor wafers 3 and the cassette 4 which are wet with the waterdrops can be dried. The slipping IPA droplets are collected by the pan 6 and are then discharged to the outside through the pipe 20. More specifically, the IPA having waterdrops and a small amount of impurities is not mixed with the IPA 7 but is discharged to the outside of the processing vessel 11. Consequently, a purity of the IPA 7 stored in the liquid storing section 9 is kept high.

When the drying processing of the semiconductor wafers 3 and the cassette 4 is completed, the jet 21 is generated again so that the cap 15 is taken off. Then, the holding arm is inserted into the processing vessel 11 again and the cassette 4 carrying the semiconductor wafers 3 is pulled up by the holding arm so that it is taken out of the processing vessel 11 through the opening 22 across the jet 21. Thereafter, the semiconductor wafers 3 and the cassette 4 thus taken out are delivered to a next processing step. Subsequently, new (i.e. unprocessed) semiconductor wafers 3 and a new cassette 4 are put into the vapor filling section 8 of the processing vessel 11. Thus, the drying processing of the semiconductor wafers 3 and the cassette 4 is performed repeatedly.

While the drying processing of the semiconductor wafers 3 and the cassette 4 is being performed, they may not be mounted on the pan 6 but be held above the pan 6 in the vapor filling section 8 by the holding arm. In this case, the cap 15 is taken off and the jet 21 is not stopped while the drying processing is being performed.

<1-3. Advantage of Apparatus 100>

When the semiconductor wafers 3 and cassette 4 to be processed are put into the processing vessel 11, when they are taken out of the processing vessel 11 and when the drying processing is being performed depending on circumstances, the cap 15 is taken off and the jet 21 is generated at the same time. Although the cap 15 is taken off, the IPA vapor 5 is obstructed by the jet 21 covering the opening 22. Therefore, it is hard for the IPA vapor 5 to diffuse to the outside of the processing vessel 11 through the opening 22. In other words, most of the IPA vapor 5 stays in the vapor filling section 8. More specifically, the jet 21 functions as a kind of curtain for preventing passage of a gas.

In the drying apparatus 100, a shape of the processing vessel 11 plays an important part such that the jet 21 effectively functions as the curtain. As shown in FIG. 2, the IPA vapor 5 generated from the IPA 7 goes up along the side wall of the processing vessel 11. As described above, however, the side wall of the processing vessel 11 is smoothly curved inward in the vicinity of the opening 22 as the opening 22 is approached.

For this reason, a flow of the IPA vapor 5 is smoothly curved inward along a curved portion of the side wall in the vicinity of the upper portion of the processing vessel 11. The IPA vapor 5 is cooled in the upper portion of the vapor filling section 8 so that the flow of the IPA vapor 5 is linked to a downward flow. In other words, a convection of the IPA vapor 5 is generated in the vapor filling section 8 along a flow 23 shown in FIG. 2. As a result, the jet 21 can effectively prevent the IPA vapor 5 filled in the vapor filling section 8 from flowing to the outside through the opening 22.

In the drying apparatus 100, the jet 21 is generated. Therefore, it is not necessary to use the cooling coil 162 which should be provided in the drying apparatus 151 according to the prior art. Consequently, it is possible to eliminate instability of a state of the IPA vapor 165 caused with a change in a state of a refrigerant fed to the cooling coil 162. In other words, a concentration of the IPA vapor 5 filled in the vapor filling section 8, an expansion thereof and the like are stabilized. As a result, objects to be processed such as the semiconductor wafers 3 and the cassette 4 are easily dried uniformly and stably. More specifically, a problem of defective dryness in the drying apparatus 151 according to the prior art can be alleviated, and yield of a semiconductor device manufactured in the semiconductor wafer 3 can be enhanced.

Since the cap 15 which can freely be put on or taken off is provided, the opening 22 can be blocked by the cap 15 when the drying apparatus 100 does not operate, when operation is being prepared or when the semiconductor wafers 3 and the cassette 4 are not put into the processing vessel 11 during the operation. For a period in which the cap 15 is put on, it is not necessary to feed the nitrogen gas to the nozzles 13. Therefore, an amount of the nitrogen gas to be used can be reduced. In addition to the nozzles 13 and the exhaust member 14, the cap 15 also functions as diffusion preventing means for preventing the IPA vapor 5 from diffusing to the outside through the opening 22.

In large scale mass production plants, a cost of using the nitrogen gas cannot be neglected. Accordingly, it is impossible to disregard the effect that the cost can be reduced by existence of the cap 15. Furthermore, a period in which the nozzles 13 operate is shortened. Consequently, wear of the nozzles 13 can be reduced so that a life of the drying apparatus can be prolonged.

While an example in which the IPA is used as a solvent to be stored in the processing vessel 11 has been described, other solvents suitable for drying the rinsed objects to be processed may be used. In general, it is possible to use an organic solvent having a lower boiling point than that of water, lower latent heat of vaporization than that of the water and a high solubility to the water. For example, TFEA (trifluoroethyl alcohol), HFIPA (hexafluoroisopropyl alcohol), PFPA (pentafluoropropyl alcohol) and the like are suitable.

While an example in which the nitrogen gas is used as a gas to be fed to the nozzles 13 through the pipes 19 has been described, other kinds of gases such as chemically stable gases, that is, nonreactive gases may generally be used. For example, an inert gas such as an argon gas may be used. The nitrogen gas is the most inexpensive of all nonreactive gases, and is easily available.

While an example in which the nozzles 13 are arranged in a line so that the jet 21 for covering the opening 22 like a film is generated has been described, a single nozzle capable of generating the film-shaped jet 21 may be provided in place of the nozzles 13 arranged in a line.

<2. First Embodiment>

Figure 1:
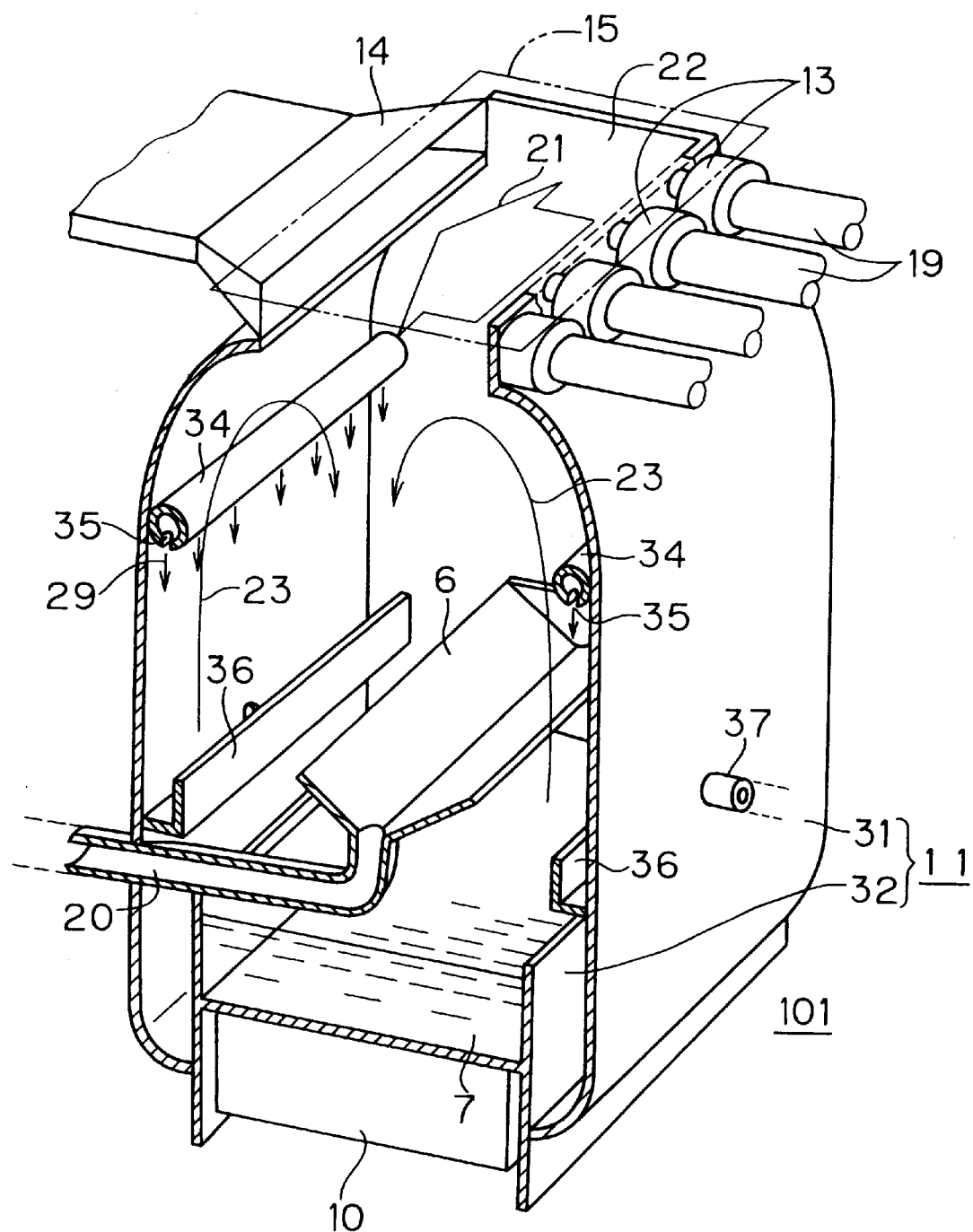
FIG. 1 is a perspective sectional view showing an apparatus according to a first embodiment.
Figure 3:
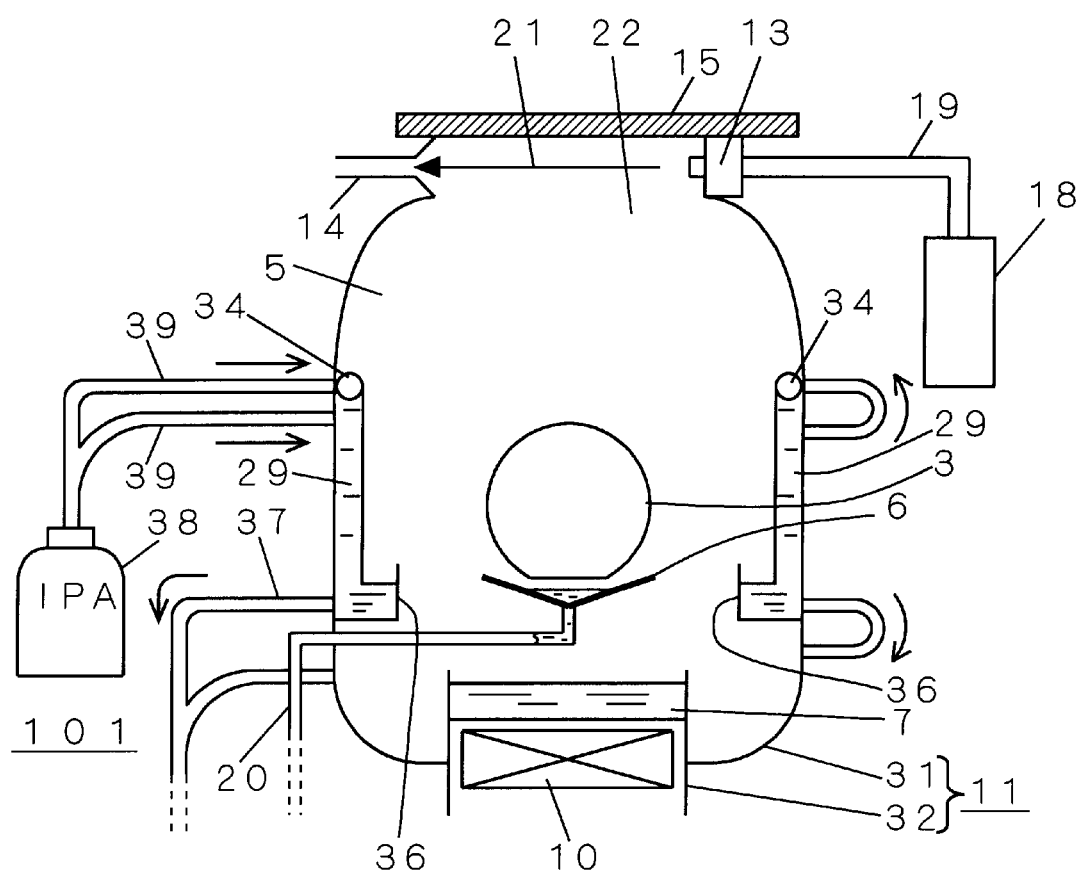
FIG. 3 is a front sectional view showing the apparatus according to the first embodiment.

FIGS. 1 and 3 are perspective and front sectional views showing a structure of a drying apparatus according to a first embodiment, respectively. A drying apparatus 101 is characteristically different from the drying apparatus 100 in that a flow of an IPA is generated so as to cover an inner surface of a side wall of a processing vessel 11, that is, an internal wall (inside wall) of a vapor filling section. By this characteristic of the drying apparatus 101, a problem of a reduction in a concentration of an IPA vapor 5 can be alleviated, and defective dryness of objects to be processed can further be prevented.

In the drying apparatus 101, the processing vessel 11 includes a vapor filling section 31 forming the side wall of the processing vessel 11 and filling the IPA vapor 5, and a liquid storing section 32 provided in a bottom portion of the processing vessel 11 for storing an IPA 7. A nozzle 34 for causing the IPA to flow downward is provided in an upper portion of the vapor filling section 31 adjacently to the internal wall. For example, the nozzle 34 is pipe-shaped with one of ends blocked, and is horizontally provided. A line of holes 35 is formed in a lower portion of the nozzle 34. The other end of the nozzle 34 is connected to an IPA feeder 38 through a pipe 39.

A liquid receiving section 36 is provided in a lower portion of the vapor filling section 31. The liquid receiving section 36 protrudes inward from the internal wall like an "L" shape in section such that the IPA flowing from the holes 35 can be collected. Furthermore, the liquid receiving section 36 extends almost horizontally opposite to the nozzle 34. A hole is formed in a portion of the vapor filling section 31 in which the liquid receiving section 36 is provided. A pipe 37 is connected to the same hole.

In the same manner as in the drying apparatus 100, a heater 10 for heating the IPA 7 is provided just below the liquid storing section 32. Similarly, a pan 6 is provided in the vapor filling section 31, and nozzles 13, an exhaust member 14 and a cap 15 are provided on a top of the processing vessel 11.

In the drying apparatus 101, when the heater 10 is driven so that the IPA 7 is heated, an IPA is fed from the IPA feeder 38 to the nozzle 34. The fed IPA flows downward from the holes 35 arranged in a line. For this reason, a flow 29 of the IPA becomes film-shaped and flows from the nozzle 34 toward the liquid receiving section 36 along the internal wall of the vapor filling section 31.

More specifically, the flow 29 of the IPA flows from an upper portion of the internal wall of the vapor filling section 31 to a lower portion thereof so as to cover the internal wall. Then, the flow 29 of the IPA is collected by the liquid receiving section 36. The collected IPA is discharged to an outside of the processing vessel 11 through the pipe 37.

Thus, the internal wall of the vapor filling section 31 is covered with the flow 29 of the IPA. Therefore, the IPA vapor 5 can be prevented from condensing uselessly on the internal wall of the vapor filling section 31. Consequently, the IPA vapor 5 is effectively utilized for condensation on a surface of an object to be processed such as semiconductor wafers 3. Accordingly, defective dryness of the object to be processed can further be prevented. As a result, yield of a semiconductor device manufactured in the semiconductor wafers 3 can be enhanced still more.

Figure 4:
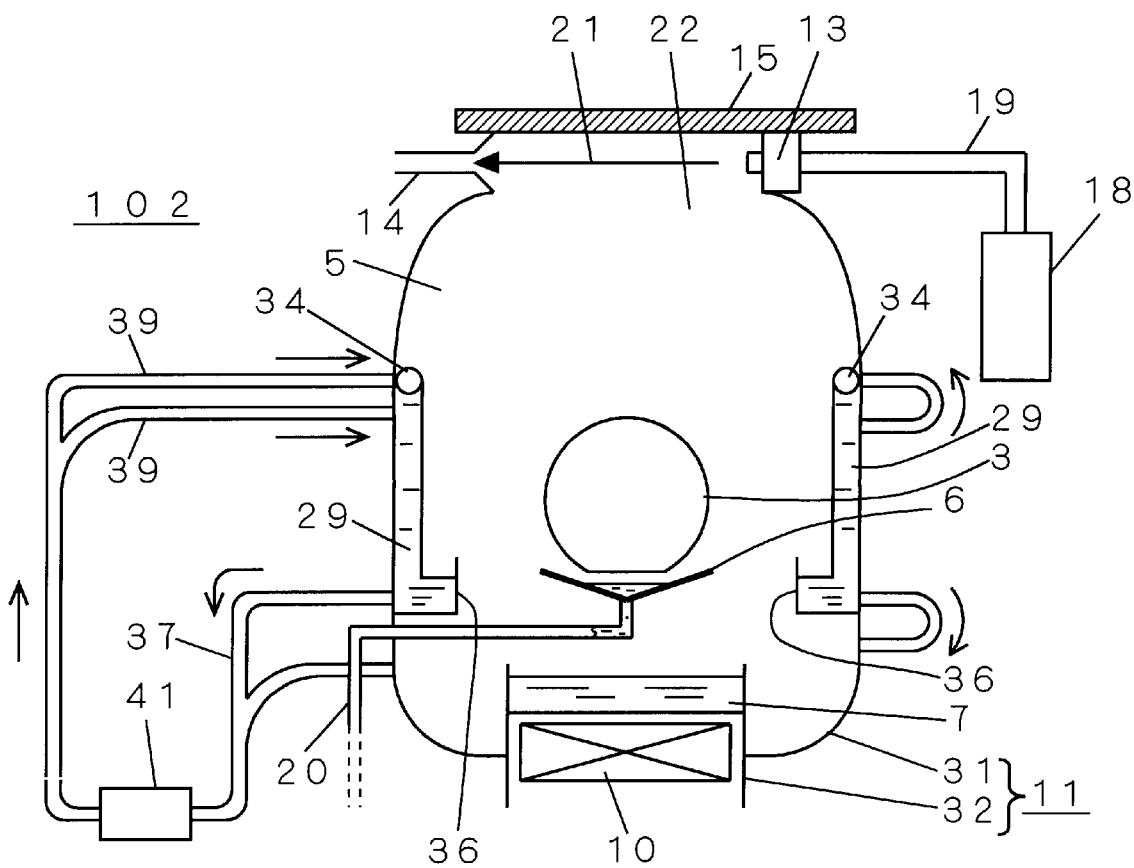
FIG. 4 is a front sectional view showing another example of the apparatus according to the first embodiment.

While FIGS. 1 and 3 have shown an example in which the IPA collected by the liquid receiving section 36 is discharged to the outside through the pipe 37, the drying apparatus may have a structure in which the collected IPA is cyclically fed to the nozzle 34 as illustrated in a front sectional view of FIG. 4. In a drying apparatus 102 shown in FIG. 4, a pump 41 for circulating the IPA is inserted between the pipes 37 and 39. The IPA collected by the liquid receiving section 36 is sucked through the pipe 37 by operation of the pump 41 and is sent to the nozzle 34 through the pipe 39.

In the drying apparatus 102, thus, the IPA is circulated from the nozzle 34 to the liquid receiving section 36 and from the liquid receiving section 36 to the nozzle 34 again. Consequently, a cost of feeding the IPA to form the flow 29 can be reduced.

The IPA gradually dissipates with circulation. Therefore, when an amount of the IPA to be circulated is insufficient, the IPA feeder 38 may be connected to any portion of a circulation path such as the pump 41 or the pipe 39 in order to compensate for the insufficient amount.

<3. Second Embodiment>

Figure 5:
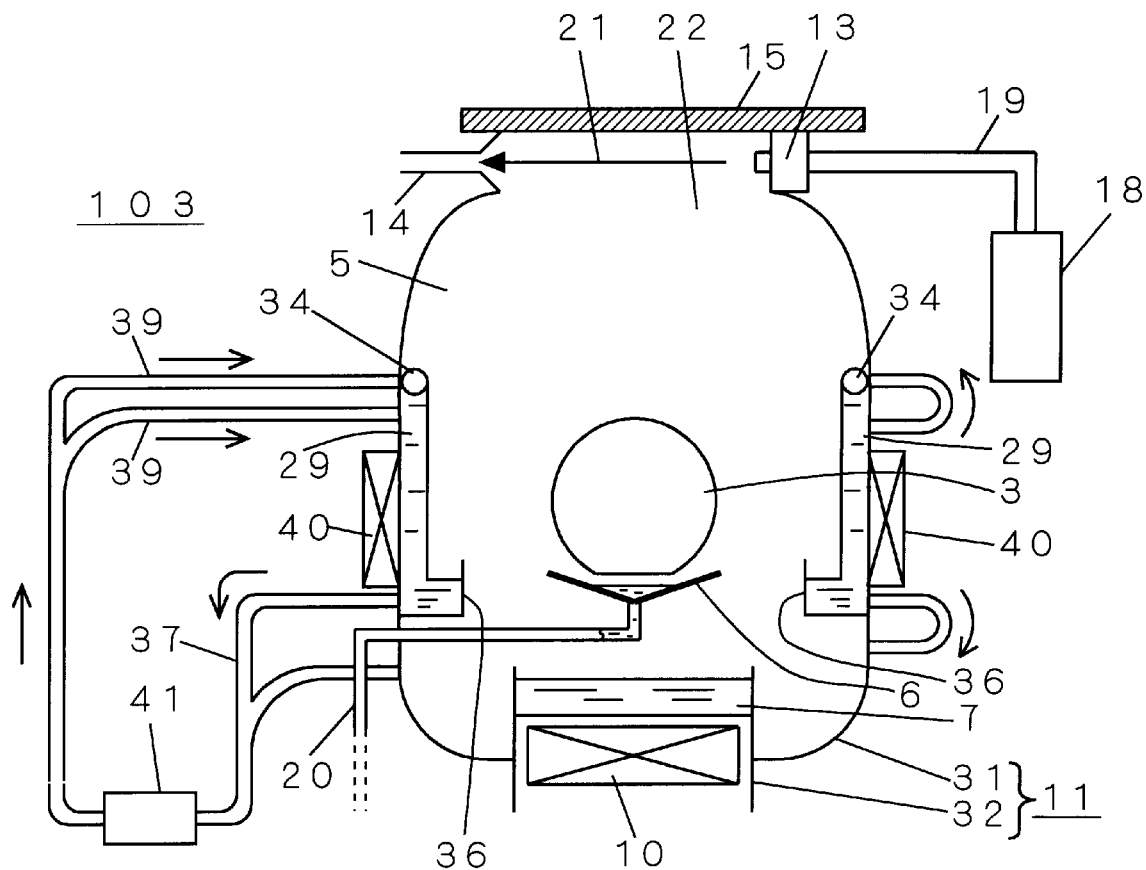
FIG. 5 is a front sectional view showing an apparatus according to a second embodiment.

FIG. 5 is a front sectional view showing a structure of a drying apparatus according to a second embodiment. A drying apparatus 103 is characteristically different from the drying apparatus 102 in that a heater 40 is provided on an external wall of a vapor filling section 31. The heater 40 is provided so as to cover a portion of the external wall (i.e. outside wall) corresponding to a portion covered with a flow 29 of an IPA on an internal wall of the vapor filling section 31 such that the flow 29 can be heated.

In the drying apparatus 103, when an IPA 7 is heated by a heater 10 and the flow 29 of the IPA is generated from a nozzle 34 to a liquid receiving section 36, the heater 40 is driven. Heat generated by the heater 40 is transferred to the flow 29 of the IPA. The flow 29 is heated so that condensation of an IPA vapor 5 into the flow 29 is reduced.

For example, when a temperature of the IPA forming the flow 29 is 30° C., a vapor pressure is 60 mmHg which is lower than a vapor pressure of 760 mmHg in a processing vessel 11. Therefore, the IPA vapor 5 condenses into the IPA. On the other hand, if the temperature of the IPA is raised to 70° C., for example, the vapor pressure becomes almost as high as that in the processing vessel 11. At this time, the IPA vapor 5 rarely condenses into the IPA.

In the drying apparatus 103 described above, the flow 29 of the IPA covering the internal wall of the vapor filling section 31 is heated. Consequently, the IPA vapor 5 can be prevented from condensing uselessly into the flow 29. Therefore, the IPA vapor 5 can be utilized more effectively for condensation on a surface of an object to be processed such as semiconductor wafers 3. Accordingly, defective dryness of the object to be processed can be prevented more. Thus, yield of a semiconductor device manufactured in the semiconductor wafers 3 can be enhanced still more.

Instead of circulating the IPA collected by the liquid receiving section 36 to the nozzle 34, the IPA may be fed from an IPA feeder 38 to the nozzle 34 in the same manner as in the drying apparatus 101. With a form in which the IPA is cyclically fed to the nozzle 34 as in the drying apparatus 103, a load of the heater 40 can be reduced.

<4. Third Embodiment>

FIG. 6 is a front sectional view showing a structure of a drying apparatus according to a third embodiment. A drying apparatus 104 is characteristically different from the drying apparatus 103 in that an IPA passing through a pipe 39 is previously heated and fed to a nozzle 34 instead of heating a flow 29 of the IPA flowing from the nozzle 34.

In the drying apparatus 104, a heater 42 is fixed to a part of the pipe 39. The IPA passing through the pipe 39 is heated by the heater 42. Therefore, when the IPA is fed as the flow 29 from the nozzle 34, a temperature of the IPA has been raised properly. Accordingly, condensation of an IPA vapor 5 into the flow 29 can be prevented more effectively. As a result, the IPA vapor 5 can be utilized more effectively for condensation on a surface of an object to be processed such as semiconductor wafers 3. Thus, defective dryness of the object to be processed can be prevented still more.

The heater 42 may be fixed to a pipe 37 or a pump 41 in place of the pipe 39. In general, the same effects can be obtained if a heater for heating the IPA passing through a circulation path from a liquid receiving section 36 to the nozzle 34 is fixed to at least a part of the circulation path.

The above-mentioned effects obtained by previously heating the IPA fed to the nozzle 34 become especially remarkable when the IPA is not circulated from the liquid receiving section 36 to the nozzle 34 but is fed to the nozzle 34 by an IPA feeder 38. When the IPA is fed to the nozzle 34 by the IPA feeder 38, the same effects can be obtained by heating the IPA feeder 38 itself in place of the pipe 39.

An apparatus having such a structure is illustrated in a front sectional view of FIG. 7. In a drying apparatus 105 shown in FIG. 7, a heater 42 is fixed to an IPA feeder 38 and an IPA fed from the IPA feeder 38 is previously heated by the heater 42. If the heater 40 of the drying apparatus 103 is provided in addition to the heater 42, a target temperature of a flow 29 can be kept more easily. In other words, the above-mentioned effects obtained by raising the temperature of the flow 29 can become more remarkable while reducing an overall load of each heater.

<5. Fourth Embodiment>

Figure 8:
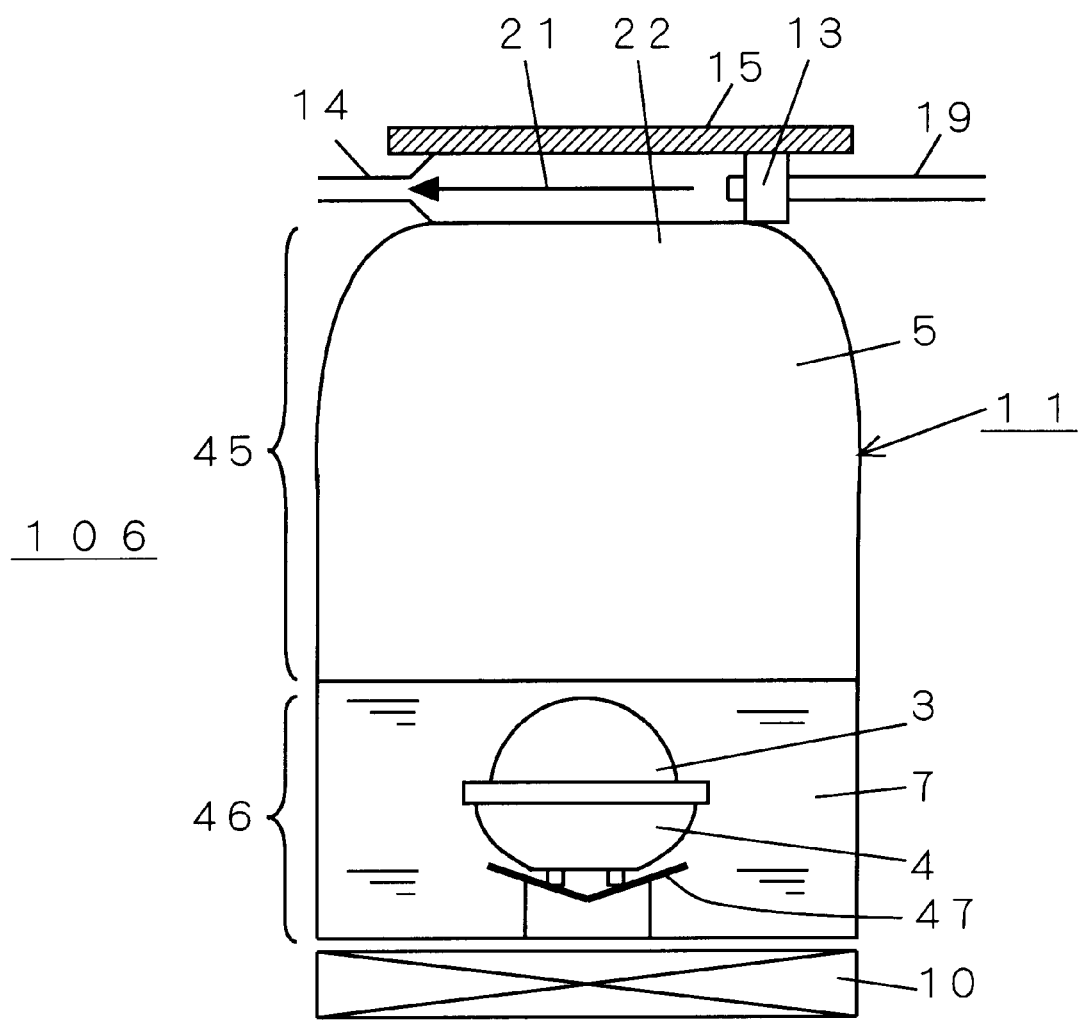
FIG. 8 is a front sectional view showing an apparatus according to a fourth embodiment.

FIG. 8 is a front sectional view showing a structure of a drying apparatus according to a fourth embodiment. A drying apparatus 106 is characteristically different from the apparatus 101 to 105 in that semiconductor wafers 3 and a cassette 4 which are to be processed are to be immersed in an IPA 7. In the drying apparatus 106, a liquid storing section 46 forming a lower portion of a processing vessel 11 can store the IPA 7, and has such a capacity and depth as to immerse the semiconductor wafers 3 and the cassette 4 in the stored IPA 7. A vapor filling section 45 forming an upper portion of the processing vessel 11 can also have such a capacity and depth as to contain the semiconductor wafers 3 and the cassette 4.

In the same manner as in the drying apparatus 100, a heater 10 for heating the IPA 7 is provided just below the liquid storing section 46. Similarly, nozzles 13, an exhaust member 14 and a cap 15 are provided on a top of the processing vessel 11. A table 47 capable of mounting the cassette 4 is provided in a bottom portion of the liquid storing section 46.

The drying apparatus 106 is used in the following procedure. First of all, the IPA 7 is fed into the processing vessel 11. A depth of the IPA 7 to be fed is regulated such that a liquid level is positioned above a head of the semiconductor wafers 3 carried on the cassette 4 which is mounted on the table 47. A portion for storing the IPA 7 at the same depth corresponds to the liquid storing section 46 in the processing vessel 11.

Then, the heater 10 is turned on with the cap 15 put on. The IPA 7 is heated by the heater 10 so that it is vaporized. Consequently, an IPA vapor 5 is generated. The IPA vapor 5 is filled into a space formed above the IPA 7, that is, into the vapor filling section 45. Before the rinsed semiconductor wafers 3 (and the cassette 4) are put into the processing vessel 11, a nitrogen gas is fed to the nozzles 13 through pipes 19. Consequently, a jet 21 is formed.

Figure 9:
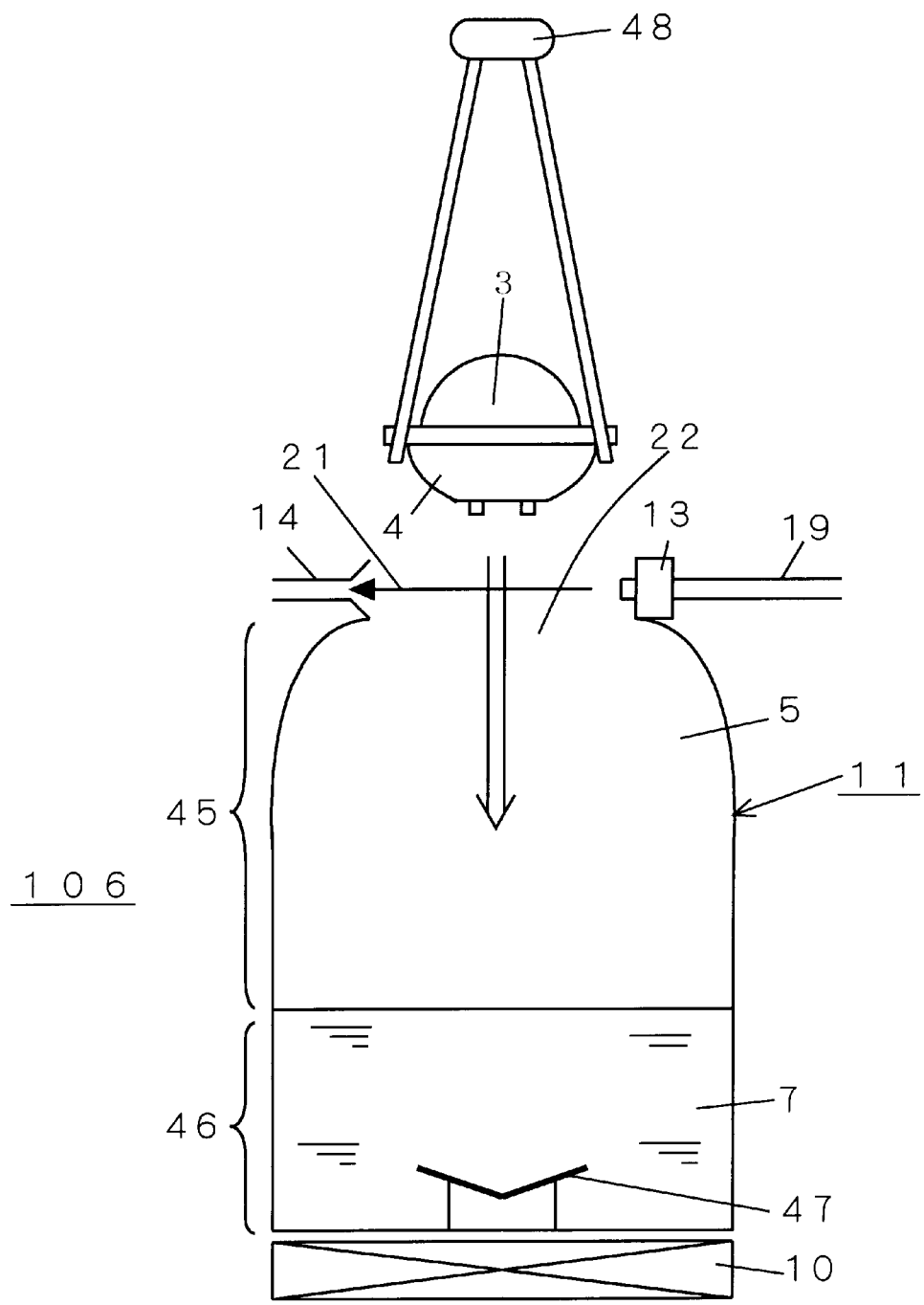
FIG. 9 is a view showing a processing step using the apparatus according to the fourth embodiment.

While the jet 21 is being spouted, the cap 15 is taken off so that the semiconductor wafers 3 to be processed are put into the processing vessel 11 as shown in FIG. 9. After a rinsing processing is completed, a lot of semiconductor wafers 3 and the cassette 4 carrying them are suspended from a holding arm 48 and are inserted from above an opening 22 into the processing vessel 11 through the opening 22 across the jet 21.

The inserted semiconductor wafers 3 and cassette 4 pass through the vapor filling section 45 quickly, and are mounted on the table 47 in the liquid storing section 46. More specifically, the objects to be processed to which waterdrops stick by rinsing are directly put into the IPA 7. When the objects are mounted on the table 47, the holding arm 48 is pulled up to an outside. After the holding arm 48 is removed to the outside, the cap 15 can be put on and the jet 21 can be stopped.

A solubility of IPA to water is substantially infinite. Therefore, the waterdrops sticking to surfaces of the objects come in contact with the IPA 7 directly so that they are mixed into the IPA 7. Consequently, the waterdrops sticking to the surfaces of the objects are wholly taken into the IPA 7. As a result, the surfaces of the objects are caused to come in contact with the IPA 7 which is diluted by an amount of the taken waterdrops.

For example, if 25 semiconductor wafers 3 having a diameter of 200 mm are to be processed at a time, about 30 liters of the IPA 7 is prepared in the liquid storing section 46. If 2 $cm^3$ of waterdrops stick to each semiconductor wafer 3, 50 $cm^3$ of water is taken into the IPA 7 by one-time immersion. As a result, the IPA 7 is diluted by 0.17%. If the IPA 7 is used until a concentration thereof is reduced to 91% at which the IPA has an azeotropic point with the water, a drying processing can be performed 50 times or more using the IPA 7 fed once. This numeric value has a high practicality.

Figure 10:
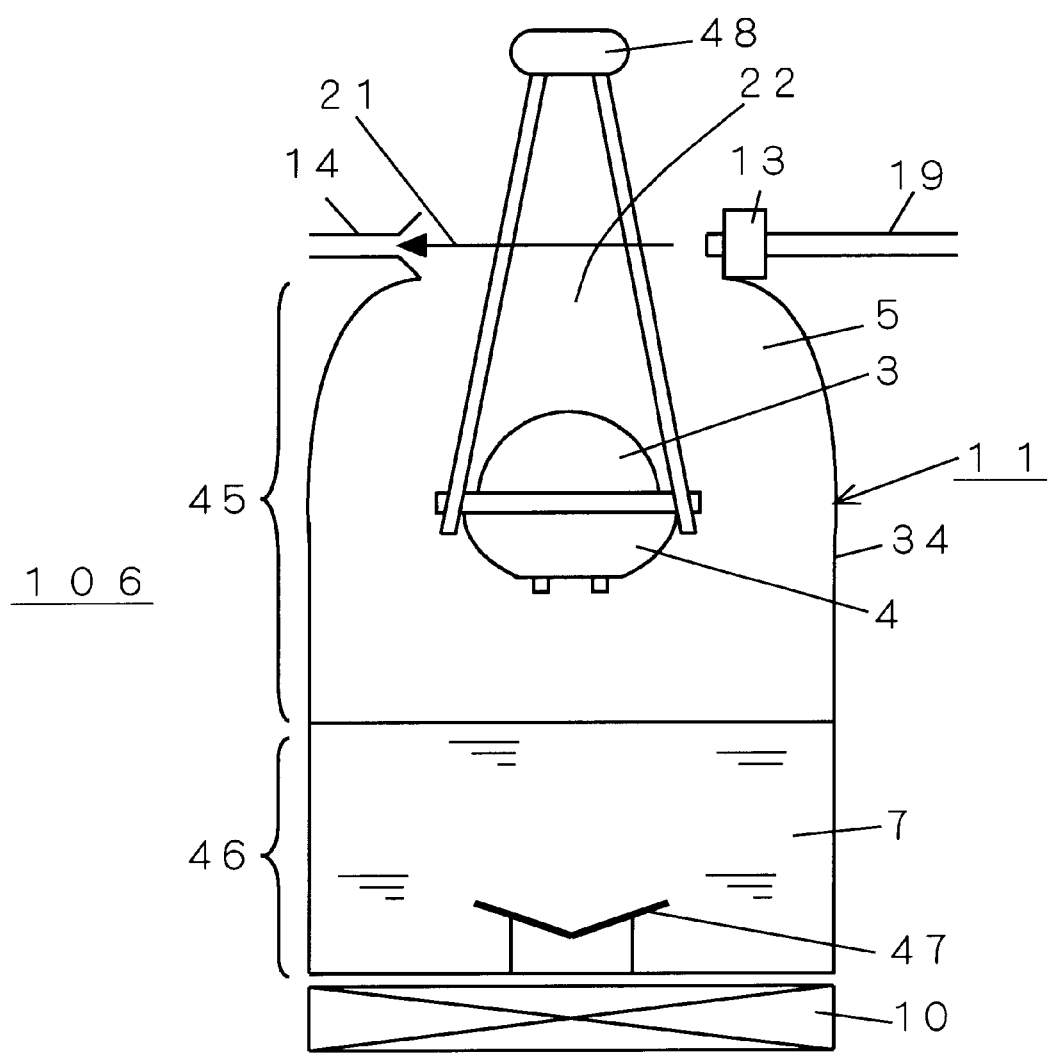
FIG. 10 is a view showing a processing step using the apparatus according to the fourth embodiment.

When the waterdrops sticking to the surfaces of the objects are removed by the IPA 7, the jet 21 is generated again so that the cap 15 is taken off as shown in FIG. 10. Then, the holding arm 48 is inserted, and the objects are pulled upward above the IPA 7 by the holding arm 48 and are exposed to the IPA vapor 5 filled in the vapor filling section 45. A surface tension of the IPA is 22 dyne/cm and is smaller than that of the water, that is, 73 dyne/cm. Therefore, the objects can be pulled up from the IPA 7 without IPA droplets sticking to the surfaces thereof. At this time, consequently, very little water remains on the surfaces of the objects.

Furthermore, the objects are exposed to the IPA vapor 5 so that a thin liquid film of a very small amount of IPA remaining on the surfaces of the objects is also removed. Thus, the objects are completely dried. At the time when the objects are pulled up from the IPA 7, very little water remains on the surfaces of the objects. Therefore, a three-phase interface having vapor, liquid and solid phases is not formed on the surfaces. Accordingly, a watermark is not generated on the surfaces after drying. Thus, clean dryness can be realized.

Then, the semiconductor wafers 3 and the cassette 4 are held by the holding arm 48 and are pulled up so that they are taken out of the processing vessel 11 through the opening 22 across the jet 21. Thereafter, the semiconductor wafers 3 and cassette 4 thus taken out are delivered to a next processing step. New (i.e. unprocessed) semiconductor wafers 3 and a new cassette 4 are put into the processing vessel 11, Thus, the semiconductor wafers 3 and the cassette 4 are dried repeatedly.

While the semiconductor wafers 3 and the cassette 4 are being dried, they may not be mounted on the table 47 but be held in the IPA 7 by the holding arm 48. In this case, while the semiconductor wafers 3 and the cassette 4 are being immersed in the IPA 7, the cap 15 is taken off and the jet 21 is not stopped.

In the drying apparatus 106 described above, the drying processing is performed by immersing the objects to be processed in the IPA 7. As compared with the apparatus 100 to 105 in which the objects are exposed to the IPA vapor 5 to perform the drying processing, defective dryness is not caused by an insufficient amount of condensation of the IPA vapor 5 which results from a variation in the number of the semiconductor wafers 3 to be put, a change in a flow of the IPA vapor 5 and the like. Thus, the drying processing can be performed stably.

<6. Fifth Embodiment>

Figure 11:
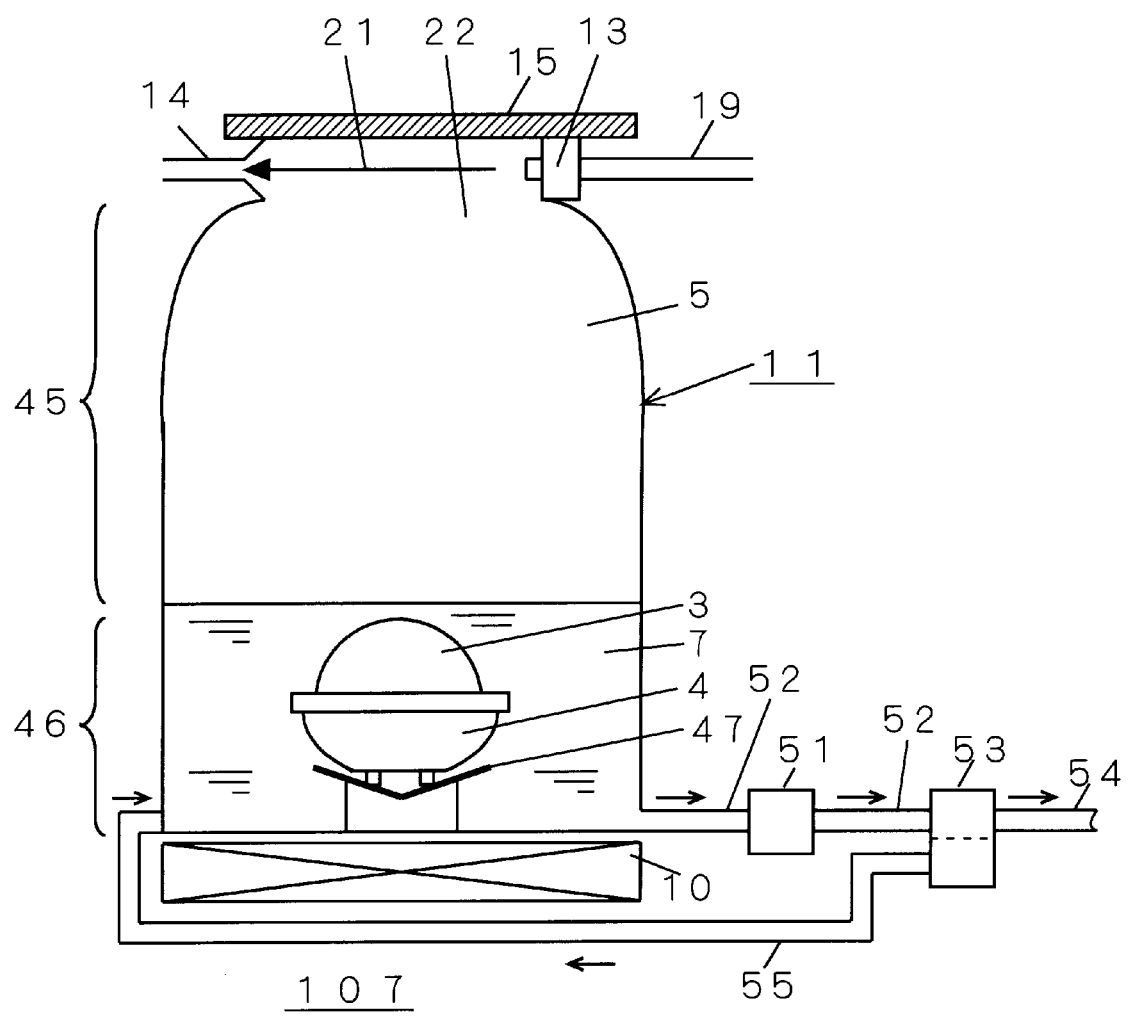
FIG. 11 is a front sectional view showing an apparatus according to a fifth embodiment.

FIG. 11 is a front sectional view showing a structure of a drying apparatus according to a fifth embodiment. A drying apparatus 107 is characteristically different from the drying apparatus 106 in that it comprises a device section for cyclically feeding an IPA 7 to a liquid storing section 46 while reprocessing the IPA 7. In the drying apparatus 107, a water/IPA separating unit 53 is connected to a bottom portion of the liquid storing section 46 through pipes 52 and 55. A pump 51 is inserted in the pipe 52.

The pump 51 sucks the IPA 7 stored in the liquid storing section 46 through the pipe 52, and sends the IPA 7 to the water/IPA separating unit 53 through the pipe 52. The water/IPA separating unit 53 includes a member formed by molding a water IPA separation film such as olefin to have a shape of a hollow yarn, for example. The IPA 7 collected through the pipe 52 is separated into an IPA liquid and water contained therein. The water corresponding to a waste liquid is discharged to an outside of the drying apparatus through a pipe 54. The IPA liquid extracted from the collected IPA 7, that is, the reprocessed IPA is returned to the liquid storing section 46 through the pipe 55.

In the drying apparatus 107, thus, the IPA 7 into which the water is mixed by a processing of drying objects is cyclically reprocessed. Therefore, a concentration of the water in the IPA 7 can be prevented from being increased. Consequently, the objects can repeatedly be processed over a long period of time without newly feeding the IPA 7. As a result, a down time of a device for exchanging the IPA 7 can be shortened so that an efficiency of the drying processing can be enhanced.

<7. Sixth Embodiment>

Figure 12:
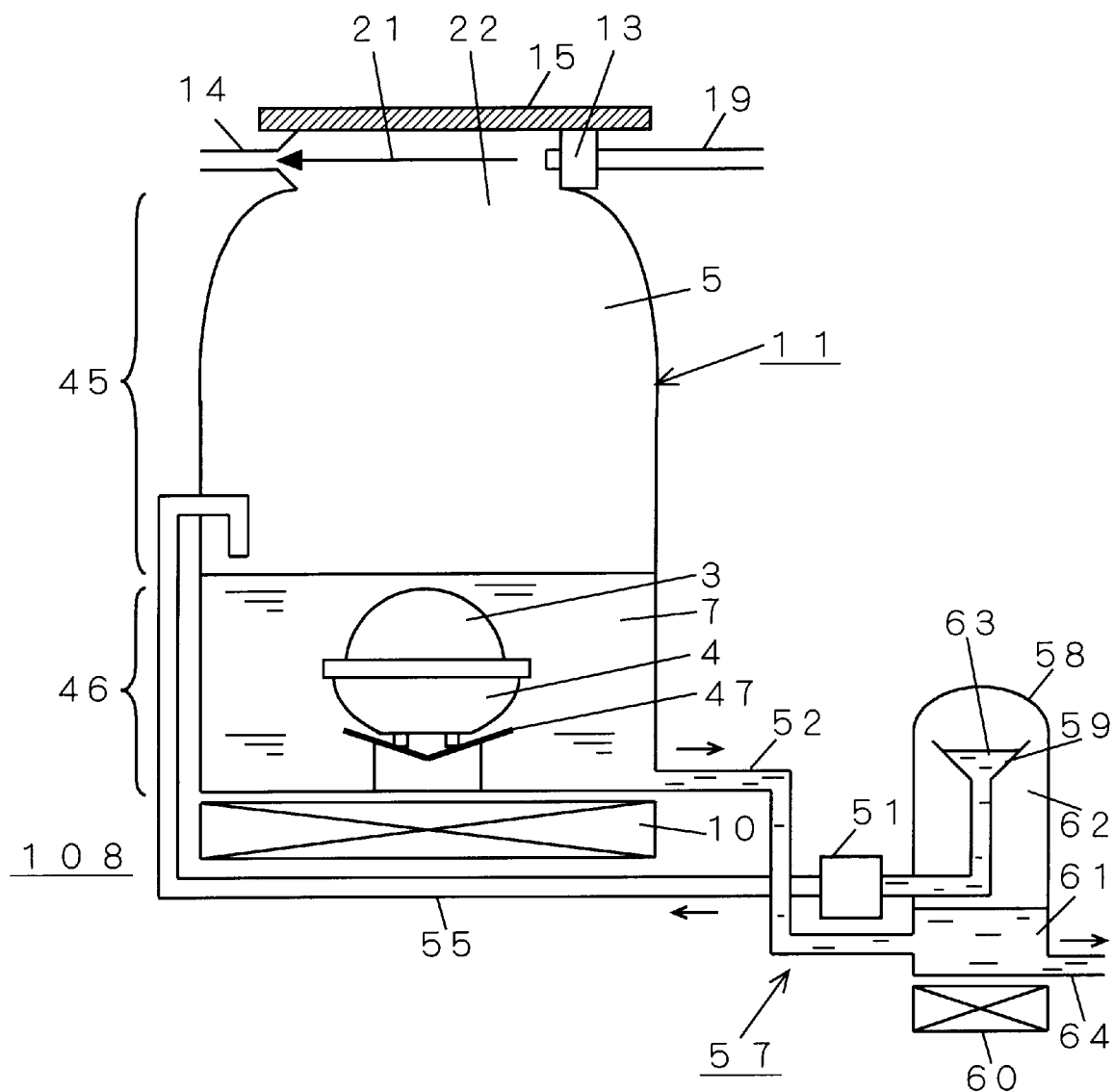
FIG. 12 is a front sectional view showing an apparatus according to a sixth embodiment.

FIG. 12 is a front sectional view showing a structure of a drying apparatus according to a sixth embodiment. In the same manner as the drying apparatus 107, a drying apparatus 108 comprises a device section for cyclically feeding an IPA 7 to a liquid storing section 46 while reprocessing the IPA 7. However, an IPA distilling unit 57 is used in place of the water/IPA separating unit 53. More specifically, the IPA distilling unit 57 is connected to a bottom portion of the liquid storing section 46 through a pipe 52. Furthermore, the IPA distilling unit 57 is connected to a vapor filling section 45 (or the liquid storing section 46) through a pipe 55, for example. A pump 51 is inserted in the pipe 55.

The IPA 7 containing water which is stored in the liquid storing section 46 is fed, through the pipe 52, to a distilling vessel 58 provided in the IPA distilling unit 57 by action of a gravity, for example. An IPA 61 stored in the distilling vessel 58 is heated by a heater 60 provided just below the distilling vessel 58. As a result, IPA in the IPA 61 containing water selectively evaporates so that an IPA vapor 62 is filled in a space formed over the IPA 61 in the distilling vessel 58.

The IPA vapor 62 condenses on a surface of a liquid collecting section 59 provided in the distilling vessel 58. An IPA 63 which has condensed contains no water. The IPA 63 is collected by the liquid collecting section 59, and is then fed to the pump 51. The pump 51 returns the collected IPA 63, that is, the reprocessed IPA into the liquid storing section 46 through the pipe 55. When the IPA evaporates, a concentration of the water contained in the IPA 61 is gradually increased. The IPA 61 containing the water at a high concentration is properly discharged to an outside of the drying apparatus through a pipe 64.

Also in the drying apparatus 108, thus, the IPA 7 into which the water is mixed by a processing of drying objects to be processed is cyclically reprocessed. Therefore, a concentration of the water in the IPA 7 can be prevented from being increased. Consequently, the objects can repeatedly be processed over a long period of time without newly feeding the IPA 7. As a result, a down time of the drying apparatus can be shortened so that an efficiency of the drying processing can be enhanced.

<8. Seventh Embodiment>

Figure 13:
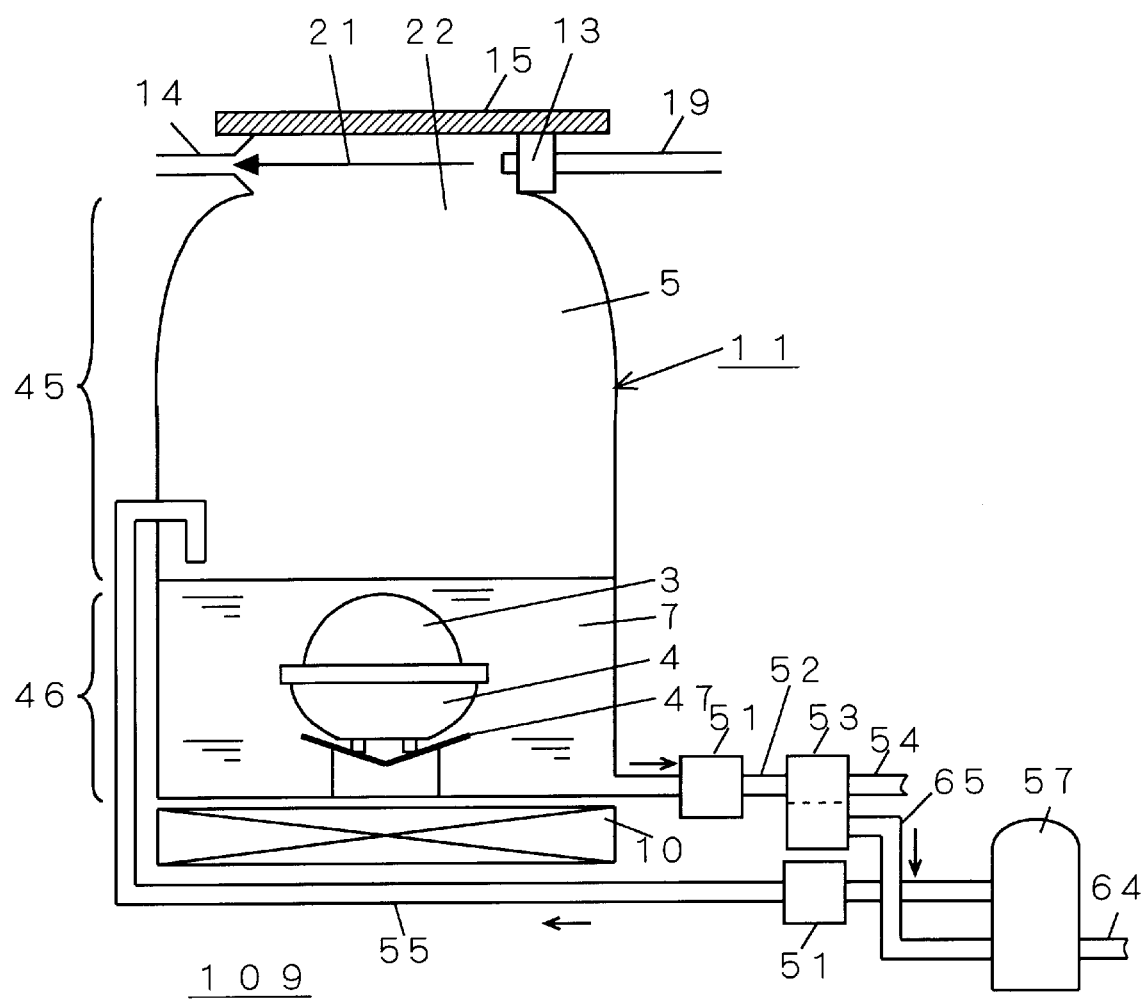
FIG. 13 is a front sectional view showing an apparatus according to a seventh embodiment.

FIG. 13 is a front sectional view showing a structure of a drying apparatus according to a seventh embodiment. In the same manner as the drying apparatus 107 and 108, a drying apparatus 109 comprises a device section for cyclically feeding an IPA 7 to a liquid storing section 46 while reprocessing the IPA 7. However, the drying apparatus 109 is characterized in that a water/IPA separating unit 53 and an IPA distilling unit 57 are used together. More specifically, the water/IPA separating unit 53 and the IPA distilling unit 57 are inserted in series in a path for cyclically reprocessing the IPA 7.

A pump 51 sucks the IPA 7 stored in the liquid storing section 46 through a pipe 52, and sends the IPA 7 to the water/IPA separating unit 53 through the pipe 52. The water/IPA separating unit 53 separates the IPA 7 collected through the pipe 52 into an IPA liquid and water contained therein. The water corresponding to a waste liquid is discharged to an outside of the drying apparatus 109 through a pipe 54.

The IPA liquid extracted from the collected IPA 7 is fed to the IPA distilling unit 57 through a pipe 65. The IPA liquid containing no water which is obtained through distillation performed by the IPA distilling unit 57, that is, the reprocessed IPA is fed to the pump 51. The pump 51 returns the reprocessed IPA into the liquid storing section 46 through a pipe 55.

As described above, the IPA 7 into which the water is mixed by a processing of drying objects to be processed is cyclically reprocessed through the water/IPA separating unit 53 and the IPA distilling unit 57. Therefore, a concentration of the water in the IPA 7 can be prevented more effectively from being increased. Consequently, it is possible to continuously perform a drying processing using the IPA 7 containing the water at a low concentration and having a high purity. Accordingly, the drying processing of good quality can be performed efficiently.

The water IPA separating unit 53 and the IPA distilling unit 57 to be inserted in a circulation path may be provided in order reverse to FIG. 13.

<9. Eighth Embodiment>

Figure 14:
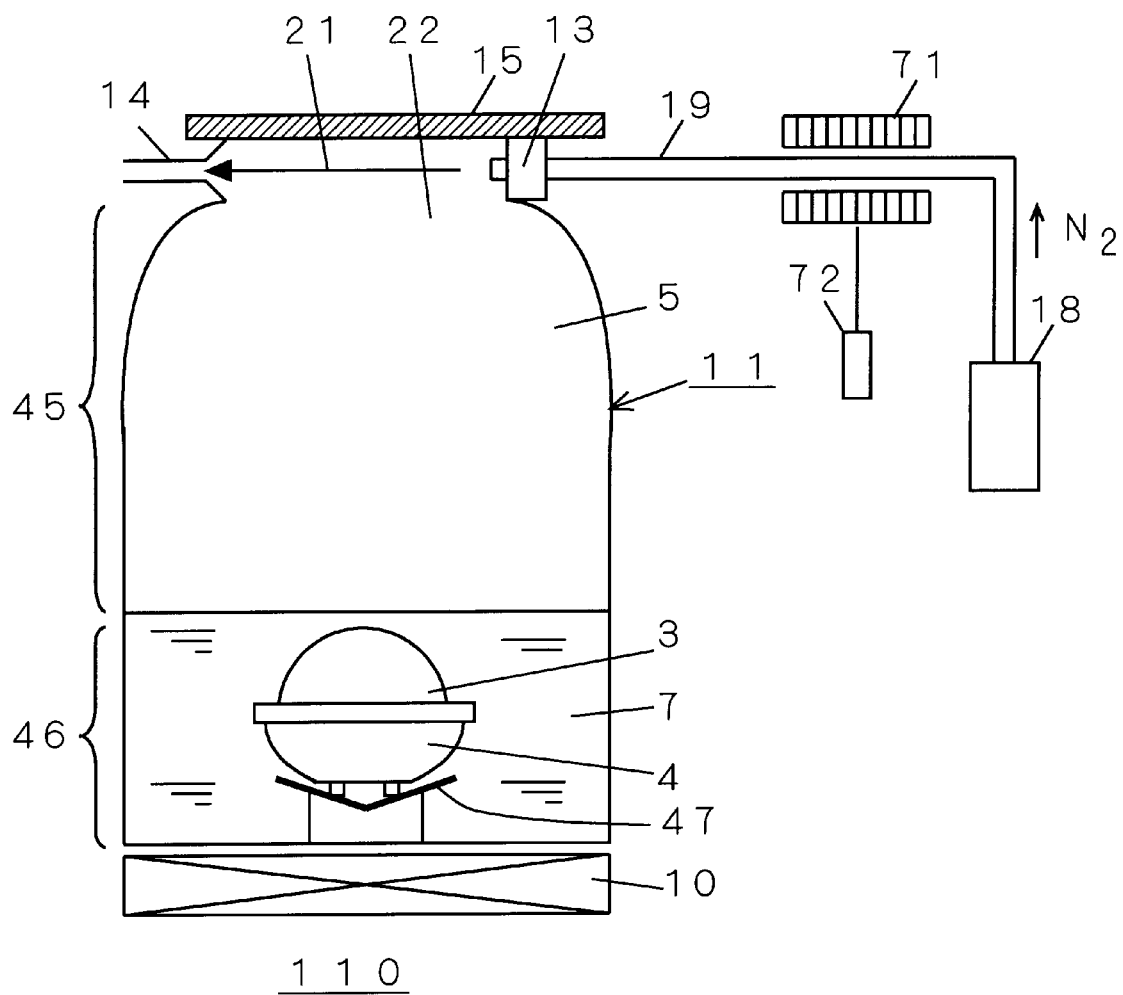
FIG. 14 is a front sectional view showing an apparatus according to an eighth embodiment.

FIG. 14 is a front sectional view showing a structure of a drying apparatus according to an eighth embodiment. A drying apparatus 110 is characteristically different from the drying apparatus 106 (FIG. 8) in that a cooler 71 for cooling a nitrogen gas flowing through a pipe 19 is provided in a part of the pipe 19. For example, an electronic thermal element, a water-cooling mechanism, an air-cooling mechanism or the like is used for the cooler 71. A controller 72 is connected to the cooler 71 through a signal line.

Figure 15:
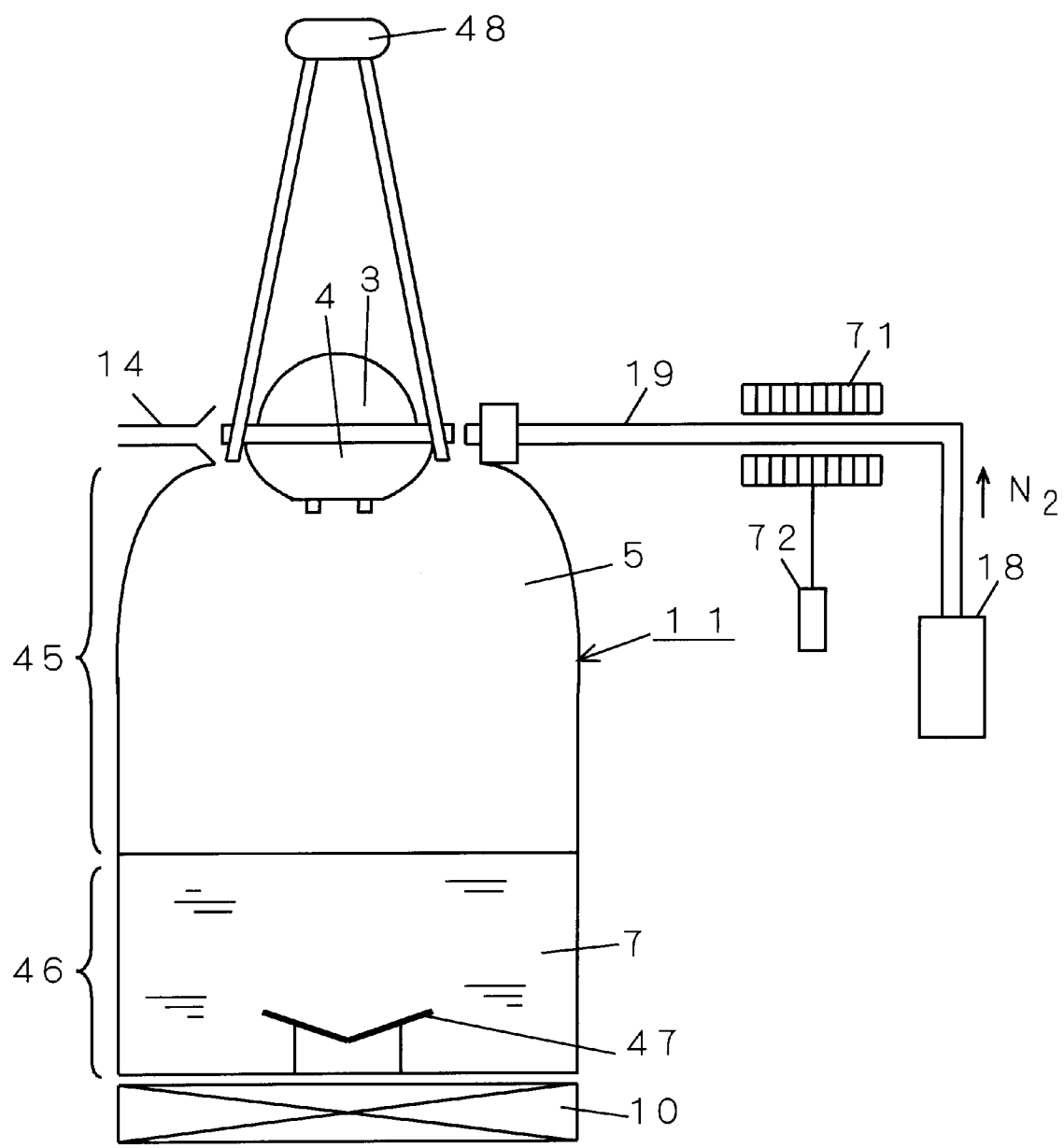
FIG. 15 is a view showing a processing step using the apparatus according to the eighth embodiment.

As shown in FIG. 15, when a cassette 4 carrying semiconductor wafers 3 is suspended from a holding arm 48 and is inserted into an opening 22 across a jet 21 from above a processing vessel 11 after rinsing, the nitrogen gas spouted as the jet 21 has been cooled to have a temperature lower than an ordinary (room) temperature by operation of the cooler 71. More specifically, the semiconductor wafers 3 and the cassette 4 are exposed to the jet 21 of the cooled nitrogen gas when they are inserted into the opening 22.

Figure 16:
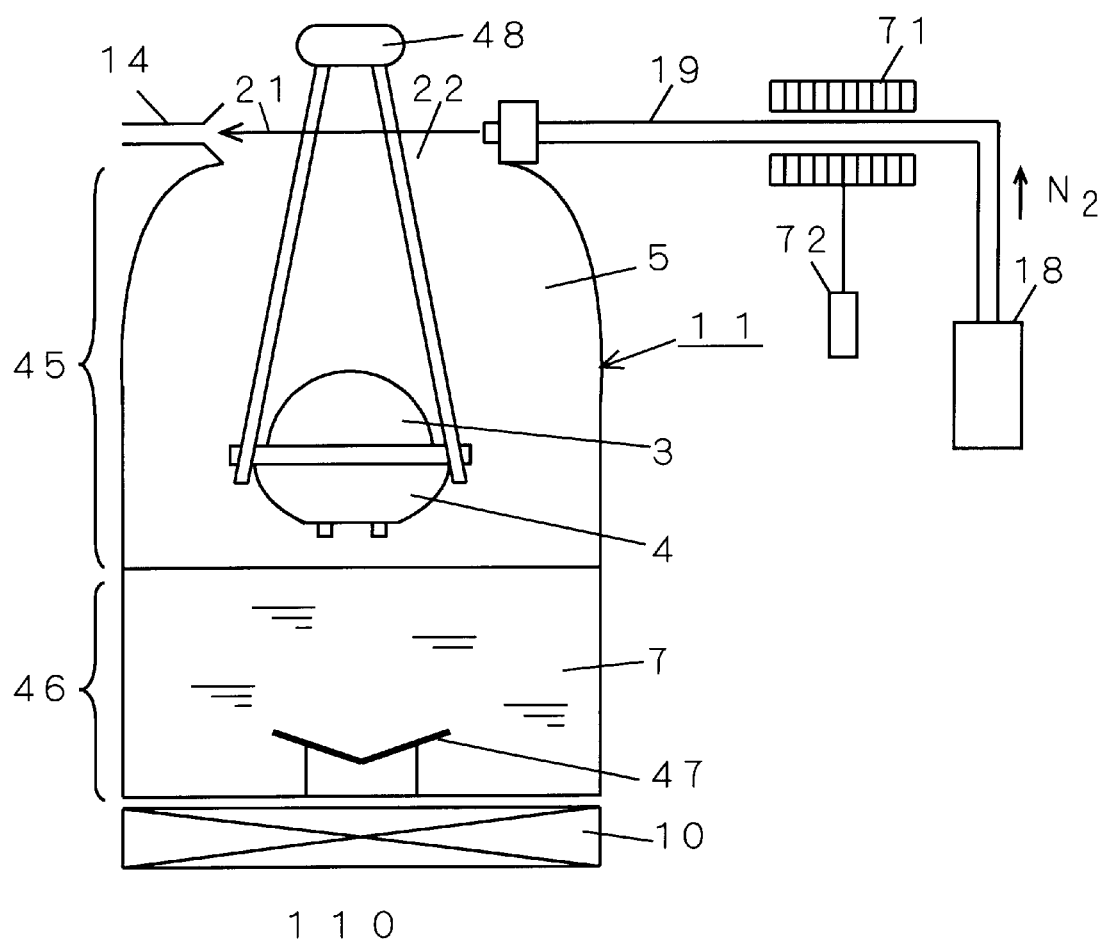
FIG. 16 is a view showing a processing step using the apparatus according to the eighth embodiment.

As a result, the semiconductor wafers 3 and the cassette 4 which have surfaces wet with waterdrops are uniformly cooled to a temperature lower than a water temperature of 25° C. which is used for usual rinsing, for example, 4 to 23° C. Then, the semiconductor wafers 3 and the cassette 4 pass through the opening 22 as shown in FIG. 16, and then pass through an inside of a vapor filling section 45 slowly and are put into an IPA 7.

When the semiconductor wafers 3 and the cassette 4 pass through the vapor filling section 45, they are exposed to an IPA vapor 5 filled in the vapor filling section 45. At this time, a large amount of the IPA vapor 5 uniformly condenses on the surfaces of the cooled semiconductor wafers 3 and cassette 4. The waterdrops sticking to the surfaces are efficiently changed into big IPA droplets to fall from the surfaces.

More specifically, a large number of waterdrops sticking to the surfaces are previously removed before the semiconductor wafers 3 and the cassette 4 are put into the IPA 7. In addition, the semiconductor wafers 3 and the cassette 4 are put into the IPA 7 while their surface temperatures are gradually approaching a temperature of the IPA vapor 5. Consequently, an excellent drying processing can be performed without causing uneven dryness.

In order to perform immersion in the IPA 7, a large amount of the IPA 7 is stored in the liquid storing section 46. Therefore, a temperature of the IPA 7 is limitedly raised by a heater 10 so as to keep safety. In the drying apparatus 110, objects to be processed are cooled before they are put into the IPA 7. For this reason, even if the temperature of the IPA 7 is not so high, a temperature difference between the objects and the IPA vapor 5 can fully be kept. As a result, the excellent drying processing can be performed with safety and no uneven dryness kept.

When the waterdrops sticking to the surfaces of the objects are removed by the IPA 7, the objects are pulled up above the IPA 7 by the holding arm 48 and are exposed to the IPA vapor 5 filled in the vapor filling section 45 as shown in FIG. 16. Consequently, a thin liquid film of a small amount of IPA remaining on the surfaces of the objects to be processed is removed. Thus, the objects are completely dried.

The controller 72 regulates a time to turn on and off the cooler 71 such that the sufficiently cooled nitrogen gas can be spouted as the jet 21 when the semiconductor wafers 3 and the cassette 4 are put in. For example, the cooler 71 is turned on a little earlier than the operation of putting new semiconductor wafers 3 and a new cassette 4 in. Consequently, the nitrogen gas forming the jet 21 is sufficiently cooled in advance. For example, the controller 72 can control the cooler 71 corresponding to movement of the cassette 4 on receipt of a signal sent from a control unit (not shown) for controlling motion of the holding arm 48.

After the semiconductor wafers 3 and the cassette 4 pass through the opening 22 and are inserted into the processing vessel 11, the cooler 71 is returned to an OFF-state, for example. Thus, the defective dryness can be prevented from being caused and unnecessary cooling operation can be reduced. If the unnecessary cooling operation does not matter, the drying apparatus 110 may have a structure in which the controller 72 is not provided and the cooler 71 is always kept in an ON-state during operation of the drying apparatus 110.

Figure 17:
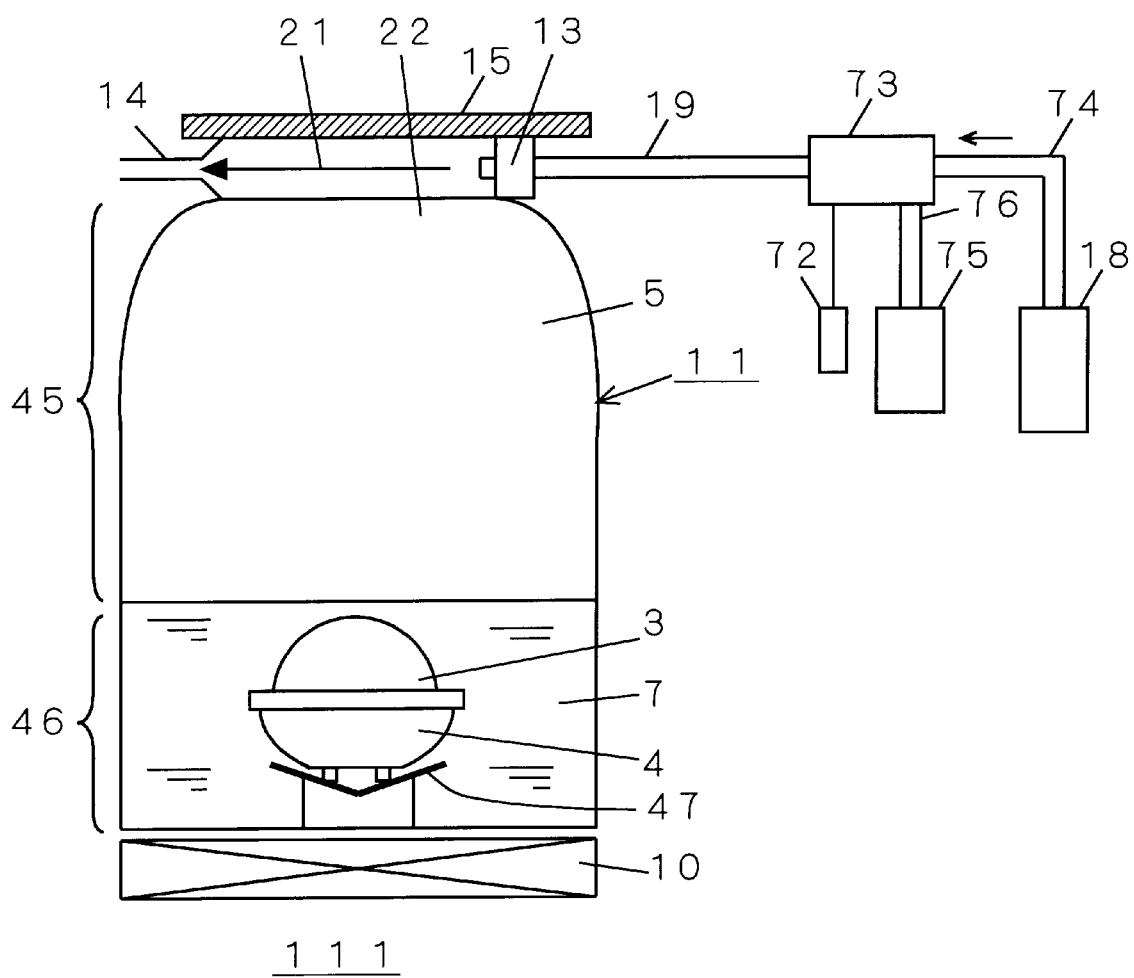
FIG. 17 is a front sectional view showing another example of the apparatus according to the eighth embodiment.

While the drying apparatus 110 has been formed to cool the nitrogen gas flowing through the pipe 19, the same effects can be obtained by such a structure as to feed a previously cooled nitrogen gas to the pipe 19. FIG. 17 is a front sectional view showing a structure of a drying apparatus having such a structure.

In a drying apparatus 111, an output of a switching valve 73 is connected to a pipe 19. A nitrogen gas feeder 18 for feeding a nitrogen gas having an ordinary temperature is connected to one of two inputs of the switching valve 73 through a pipe 74. A cooled nitrogen gas feeder 75 for feeding a cooled nitrogen gas is connected to the other input of the switching valve 73 through a pipe 76. The controller 72 is further connected to the switching valve 73 through a signal line.

When the nitrogen gas having the ordinary temperature should be spouted as a jet 21, the switching valve 73 selects the pipe 74 for delivering the nitrogen gas having the ordinary temperature and causes the pipe 74 to communicate with the pipe 19 so that the nitrogen gas having the ordinary temperature is fed to nozzles 13. When the cooled nitrogen gas should be spouted as the jet 21, that is, the objects to be processed should be put into a processing vessel 11 across the jet 21, the switching valve 73 selects the pipe 76 for delivering the cooled nitrogen gas and causes the pipe 76 to communicate with the pipe 19 so that the cooled nitrogen gas is fed to the nozzles 13. Switching operation performed by the switching valve 73 is controlled by the controller 72.

As described above, the drying apparatus 111 also has such a structure that the nitrogen gas having the ordinary temperature and the cooled nitrogen gas are selectively spouted as the jet 21 in response to demands. Therefore, defective dryness can be prevented and an amount of the cooled nitrogen gas to be used can be reduced in the same manner as in the drying apparatus 110.

Figure 18:
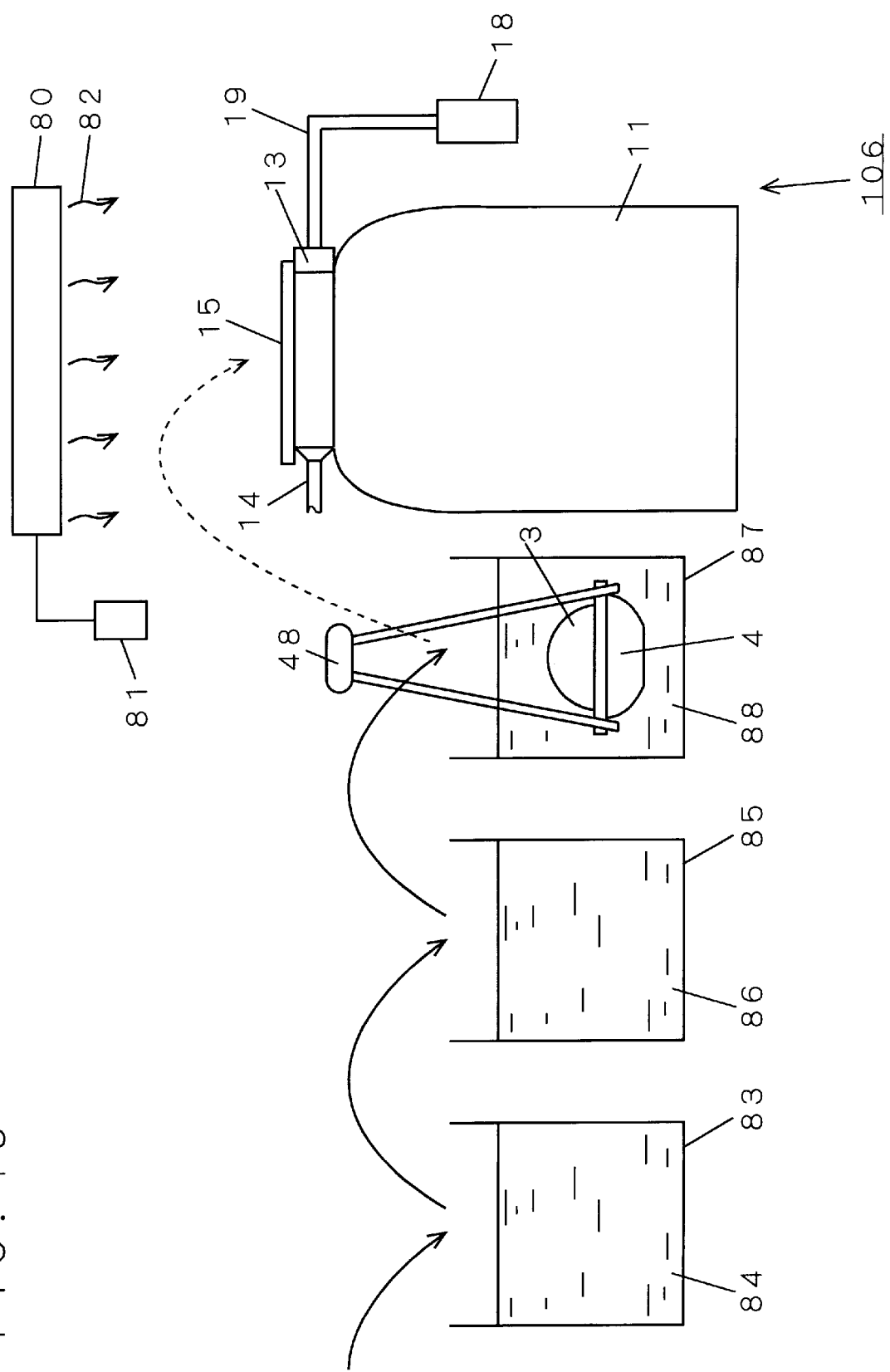
FIG. 18 is a view showing yet another example of a structure of the apparatus according to the eighth embodiment.

The drying apparatus may have such a structure that the semiconductor wafers 3 and cassette 4 to be processed are previously cooled before passing across the jet 21 instead of generating the jet 21 of the cooled nitrogen gas. FIG. 18 illustrates a drying apparatus having such a structure. In the drying apparatus, a cooler 80 for cooling air is provided above the drying apparatus 106 (FIG. 8). The cooler 80 generates a downward flow 82 of the cooled air according to an instruction of a controller 81.

The semiconductor wafers 3 and the cassette 4 are held by a holding arm 48 and are immersed in a chemical 84 stored in a processing vessel 83. After a cleaning processing is performed by using the chemical 84, the semiconductor wafers 3 and the cassette 4 are immersed in rinsing water 86 stored in a processing vessel 85. Thus, the rinsing processing is performed. Then, the semiconductor wafers 3 and the cassette 4 are immersed in rinsing water 88 stored in another processing vessel 87 to perform an additional rinsing processing.

When the rinsing processing using the rinsing water 88 is completed, the cooler 80 starts to operate according to the instruction of the controller 81 and generates the flow 82 of the cooled air toward the processing vessel 11 provided just below the cooler 80. While the flow 82 is being generated, the semiconductor wafers 3 and the cassette 4 are pulled up from the rinsing water 88, transferred above the processing vessel 11 and inserted into the processing vessel 11.

In this process, the semiconductor wafers 3 and the cassette 4 which have completely been rinsed pass through the flow 82 of the cooled air. As a result, the semiconductor wafers 3 and the cassette 4 which are to be dried are cooled before they are inserted into the processing vessel 11. In the same manner as in the apparatus 110 and 111, accordingly, an excellent drying processing can be performed with safety and no uneven dryness kept.

<10. Ninth Embodiment>

Figure 19:
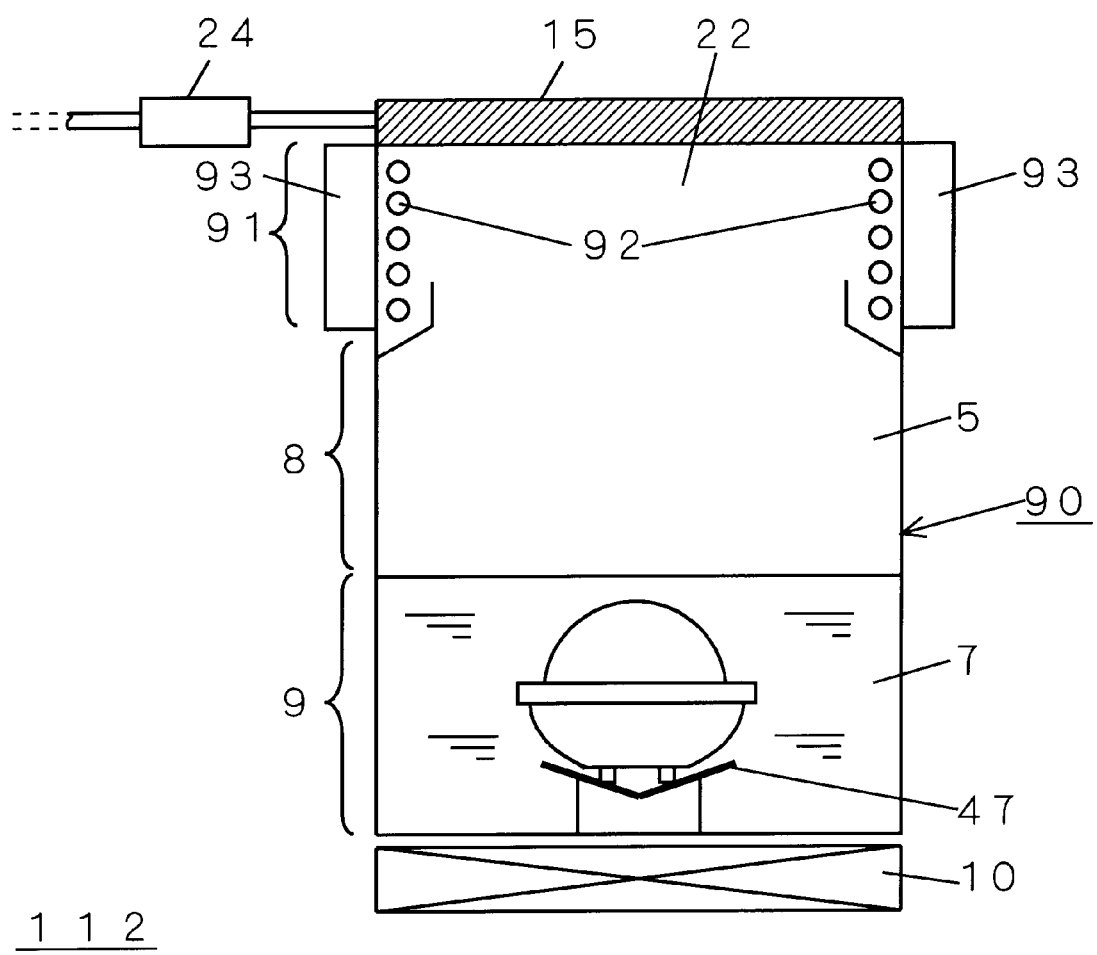
FIG. 19 is a front sectional view showing an apparatus according to a ninth embodiment.

FIG. 19 is a front sectional view showing a structure of a drying apparatus according to a ninth embodiment. A liquid storing section 9 forming a lower portion of a processing vessel 90 of a drying apparatus 112 can store an IPA 7 and has such a capacity and depth that semiconductor wafers 3 and a cassette 4 can be immersed in the stored IPA 7. A table 47 capable of mounting the cassette 4 is fixed to a bottom portion of the liquid storing section 9. A heater 10 for heating the IPA 7 is provided just below the liquid storing section 9.

A cooling section 91 is provided over a vapor filling section 8. An upper portion of the cooling section 91 is opened such that objects to be processed can be put in and out. Preferably, an opening 22 can freely (removably) be covered with a cap 15. A cooling coil 92 is fixed to an inside of the cooling section 91 along an internal wall. A cooler 93 having an electronic thermal element is attached to an outside of the cooling section 91 along an external wall, for example.

In the drying apparatus 112, a refrigerant such as cooling water is fed to the cooling coil 92 so that an IPA vapor 5 can be prevented from diffusing to an outside in the same manner as the drying apparatus 151 according to the prior art. Furthermore, the cooler 93 is provided together with the cooling coil 92 so that a cooling ability can be increased. In the drying apparatus 112, the cooling coil 92, the cooler 93 and the cap 15 form diffusion preventing means.

Figure 20:
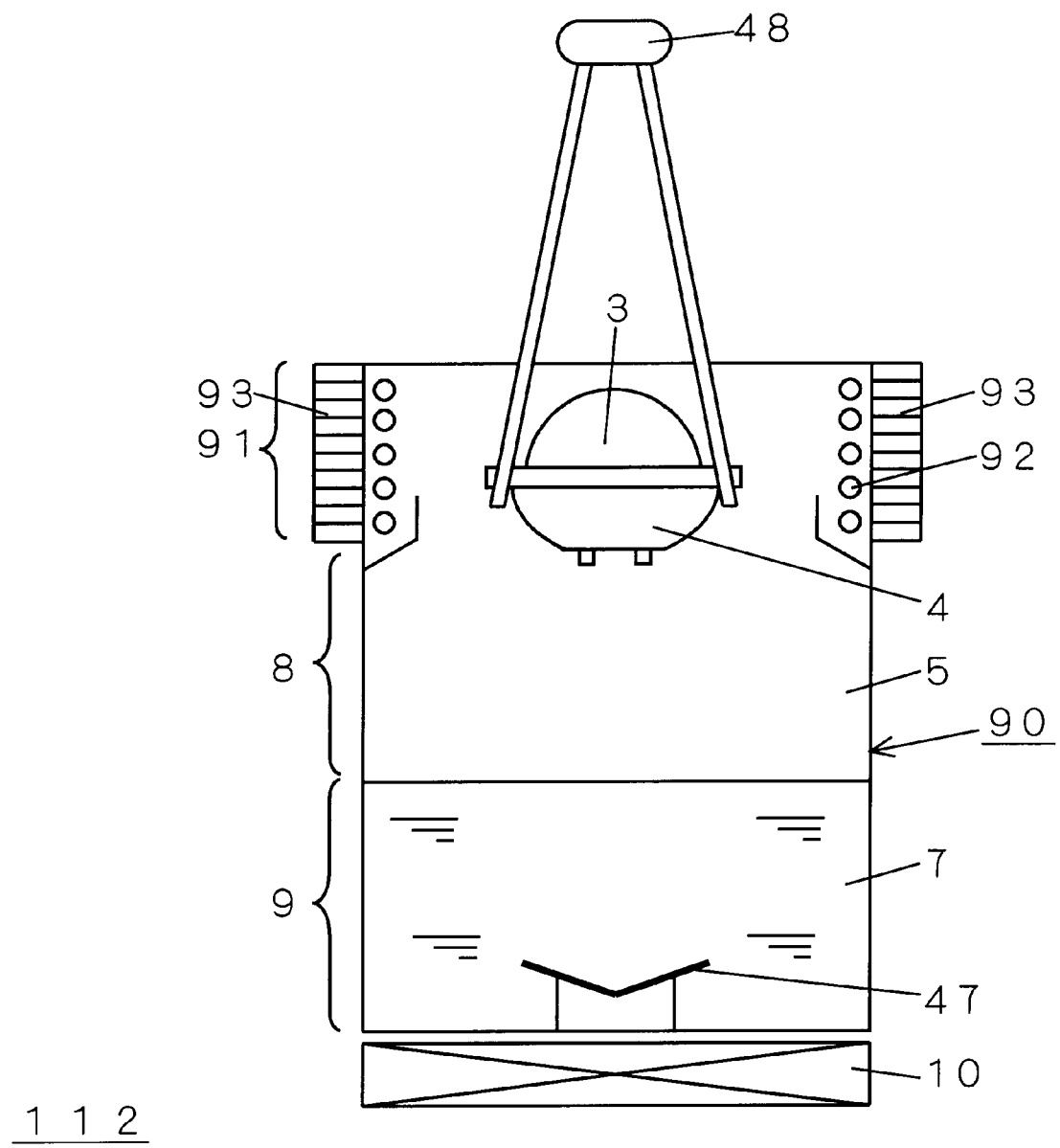
FIG. 20 is a view showing a processing step using the apparatus according to the ninth embodiment.

Since the cooling coil 92 and the cooler 93 show a high cooling ability in cooperation with each other in the drying apparatus 112, they not only prevent the IPA vapor 5 from diffusing but precool the objects to be processed such as the semiconductor wafers 3 which have completely been rinsed. As shown in FIG. 20, when the semiconductor wafers 3 and the cassette 4 which have completely been rinsed are inserted into the processing vessel 90 from above through the opening 22, they pass through a region surrounded by the cooling coil 92 and the cooler 93, that is, an inner portion of the cooling section 91.

A gas such as air which exists in the same region is cooled by the cooling coil 92 and the cooler 93. Consequently, the semiconductor wafers 3 and the cassette 4 as the objects to be processed are cooled when passing through the same region. The objects pass through the same region slowly, and then pass through an inside of the vapor filling section 8 slowly and are put into the IPA 7.

Also in the drying apparatus 112, thus, the objects are cooled before they are exposed to the IPA vapor 5 filled in the vapor filling section 8. In the same manner as in the drying apparatus 110 and 111, accordingly, an excellent drying processing can be performed with safety and no uneven dryness kept.

While FIGS. 19 and 20 have shown an example in which both the cooling coil 92 and the cooler 93 are provided to cool a gas in the cooling section 91, only one of them may be provided if a sufficient cooling ability can be obtained.

<11. Tenth Embodiment>

Figure 21:
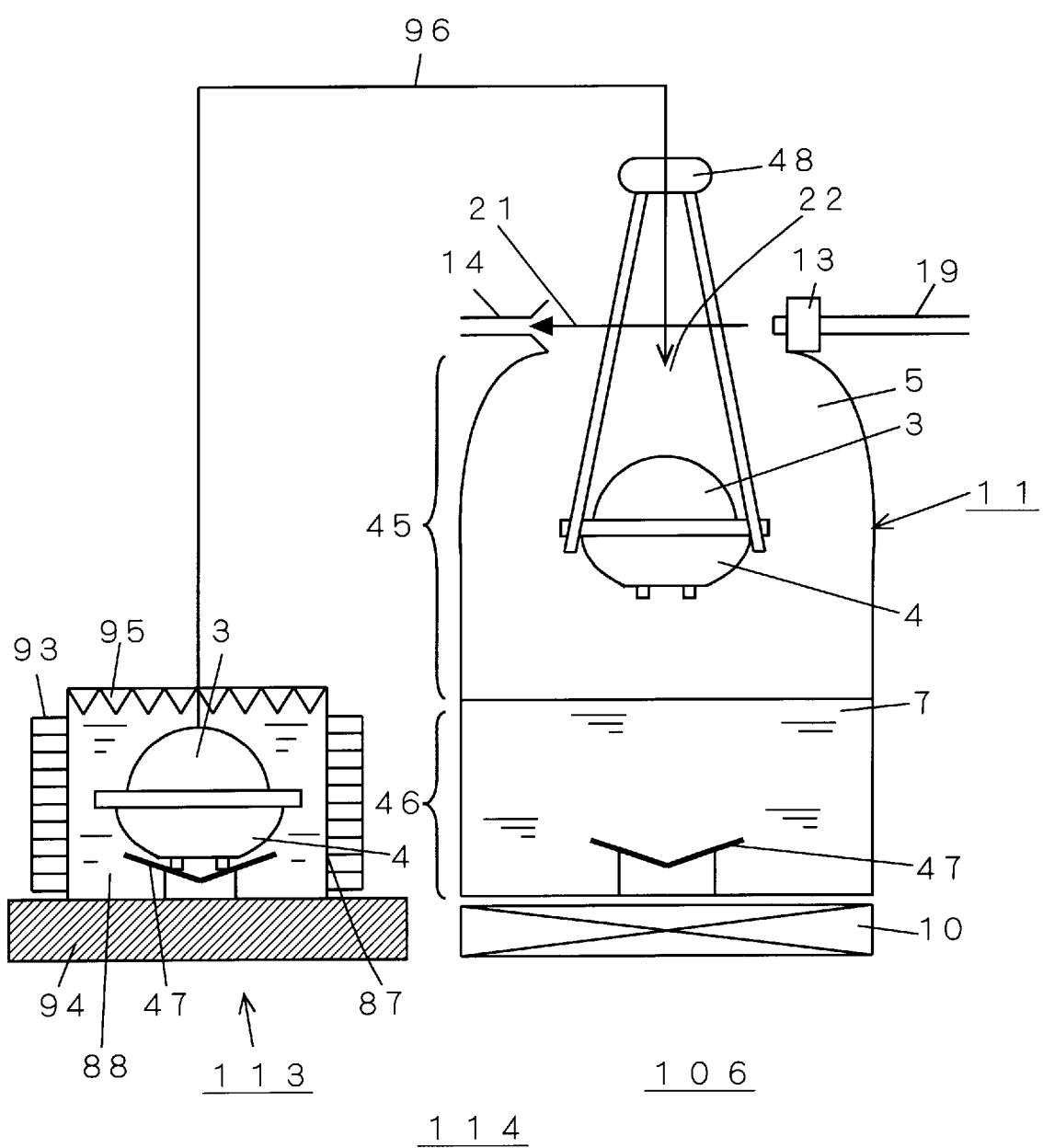
FIG. 21 is a front sectional view showing an apparatus according to a tenth embodiment.

FIG. 21 is a front sectional view showing a structure of a drying apparatus according to a tenth embodiment. A drying apparatus 114 comprises the drying apparatus 106 (FIG. 8) and a cooling and rinsing device 113 provided adjacently to the drying apparatus 106. The cooling and rinsing device 113 is formed to rinse and cool objects to be processed such as semiconductor wafers 3 by using rinsing water immediately before a drying processing is executed by the drying apparatus 106.

More specifically, the cooling and rinsing device 113 includes a base table 94 provided on a floor or the like, a processing vessel 87 fixed onto the base table 94, a cooler 93 attached to an outer surface of a side wall of the processing vessel 87, a table 47 provided in a bottom portion of the processing vessel 87, and a cap 95 for freely covering an upward opening of the processing vessel 87.

Rinsing water 88 is stored in the processing vessel 87. The cooler 93 cools the rinsing water 88 to a temperature which ranges from 4° C. to 23° C., for example. The semiconductor wafers 3 mounted on a cassette 4 are immersed in the rinsing water 88 stored in the processing vessel 87 immediately before the drying processing is performed by the drying apparatus 106, that is, at a final step of a rinsing processing. Consequently, the semiconductor wafers 3 and the cassette 4 as the objects to be processed are rinsed and cooled to a temperature of the rinsing water 88 at the same time.

Then, the cassette 4 carrying the semiconductor wafers 3 is held by a holding arm 48, pulled up from the rinsing water 88 along a path 96, horizontally transferred above a processing vessel 11 provided in the drying apparatus 106, and put into the processing vessel 11 through an opening 22. The semiconductor wafers 3 and the cassette 4 as the objects pass slowly through an inside of a vapor filling section 45 filled with an IPA vapor 5, and are then put into an IPA 7 stored in a liquid storing section 46.

Also in the drying apparatus 114, thus, the objects are cooled before they are exposed to the IPA vapor 5 filled in the vapor filling section 45. In the same manner as in the drying apparatus 110 to 112, accordingly, an excellent drying processing can be performed with safety and no uneven dryness kept.

<12. Eleventh Embodiment>

Figure 22:
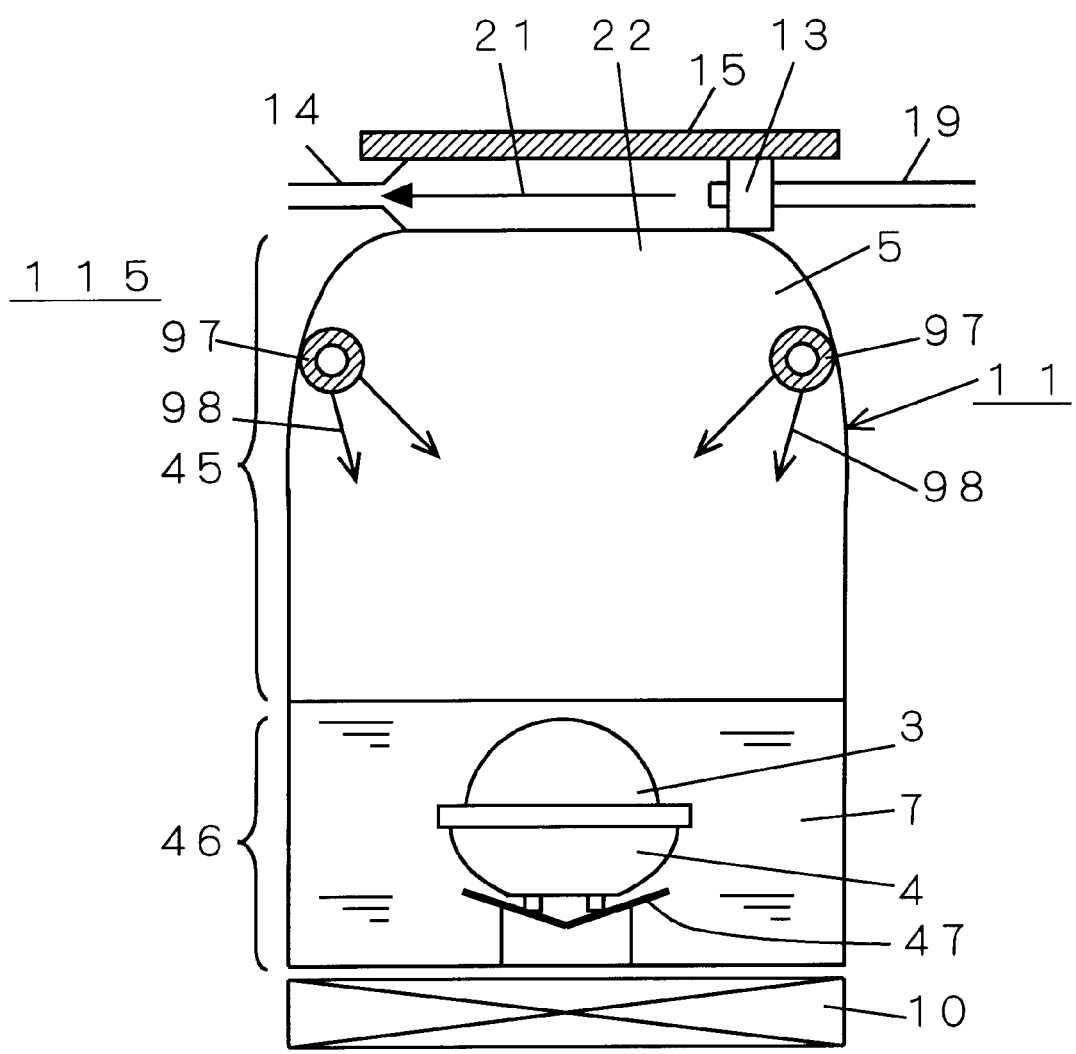
FIG. 22 is a front sectional view showing an apparatus according to an eleventh embodiment.

FIG. 22 is a front sectional view showing a structure of a drying apparatus according to an eleventh embodiment. A drying apparatus 115 is characteristically different from the drying apparatus 106 (FIG. 8) in that a mist spray nozzle 97 for spraying a mist of an IPA is provided in an upper portion of a vapor filling section 45. For example, the mist spray nozzle 97 is provided adjacently to an internal wall of the vapor filling section 45.

The mist spray nozzle 97 is pipe-shaped with one of ends blocked in the same manner as the nozzle 34 (FIG. 1) and is horizontally provided, for example. A plurality of minute holes (not shown) capable of spraying the IPA like a mist are formed on a side wall of the mist spray nozzle 97 such that the IPA is sprayed toward objects to be processed which pass from an opening 22 to the vapor filling section 45, toward those housed in the vapor filling section 45 or toward both of them. For example, the other end of the mist spray nozzle 97 is connected to an IPA feeder 38 (FIG. 3) through a pipe (not shown) and sprays a mist 98 of the IPA on receipt of a supply of the IPA from the IPA feeder 38.

Figure 23:
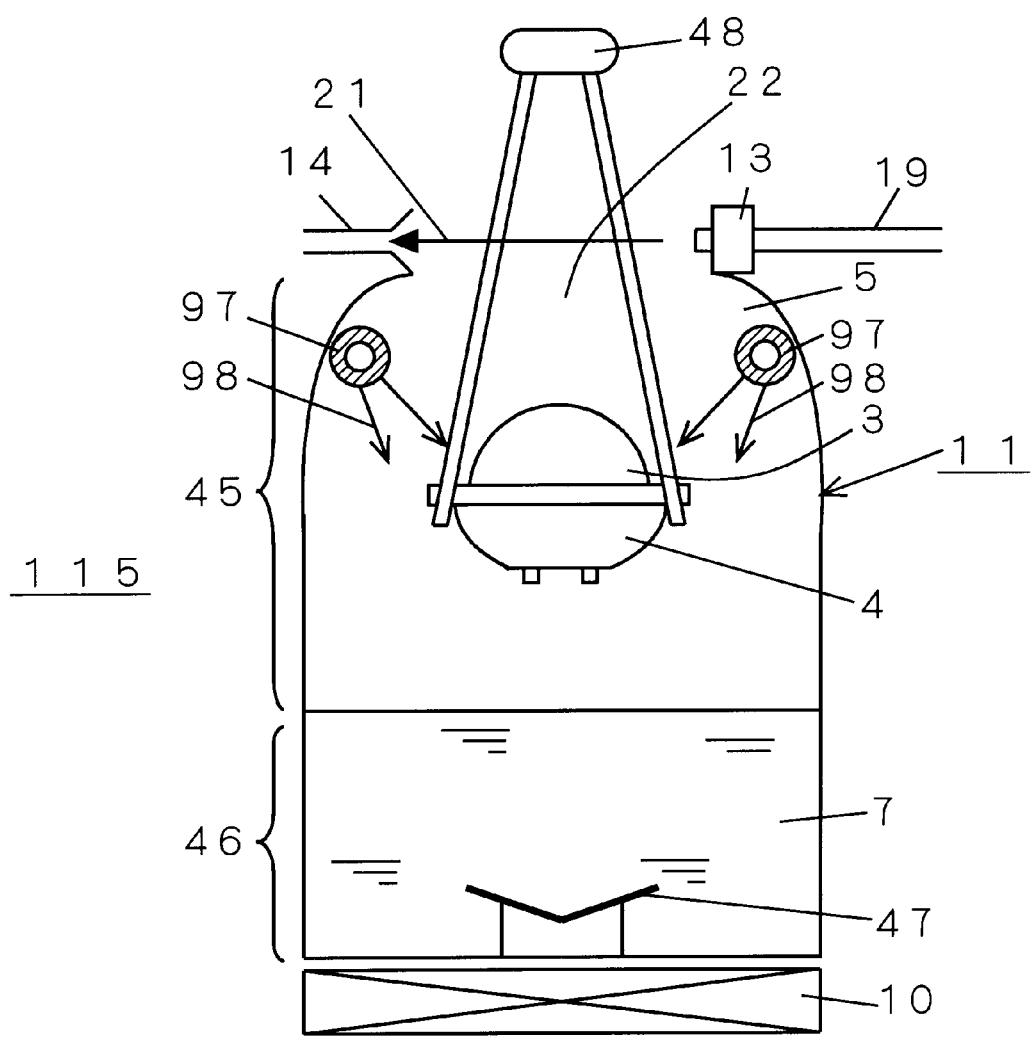
FIG. 23 is a view showing a processing step using the apparatus according to the eleventh embodiment.

As shown in FIG. 23, when inserted into a processing vessel 11 from above through the opening 22 and going from the opening 22 toward the vapor filling section 45, going toward an IPA 7 stored in a liquid storing section 46 through the vapor filling section 45, or going toward both of them, the objects such as semiconductor wafers 3 mounted on a cassette 4 are exposed to the mist 98 sprayed by the mist spray nozzle 97. In other words, the objects are exposed to the mist 98 before they are exposed to an IPA vapor 5 filled in the vapor filling section 45 or at the same time that they are exposed to the IPA vapor 5 (or both before and at the same time).

The objects are exposed to the mist 98 so that their surfaces become wet with the IPA very quickly. Consequently, waterdrops sticking to the surfaces are efficiently changed into big IPA droplets to fall from the surfaces. In other words, a large number of waterdrops sticking to the surfaces are previously removed before the objects to be processed are put into the IPA 7. Therefore, an excellent drying processing can be performed without causing uneven dryness.

Figure 24:
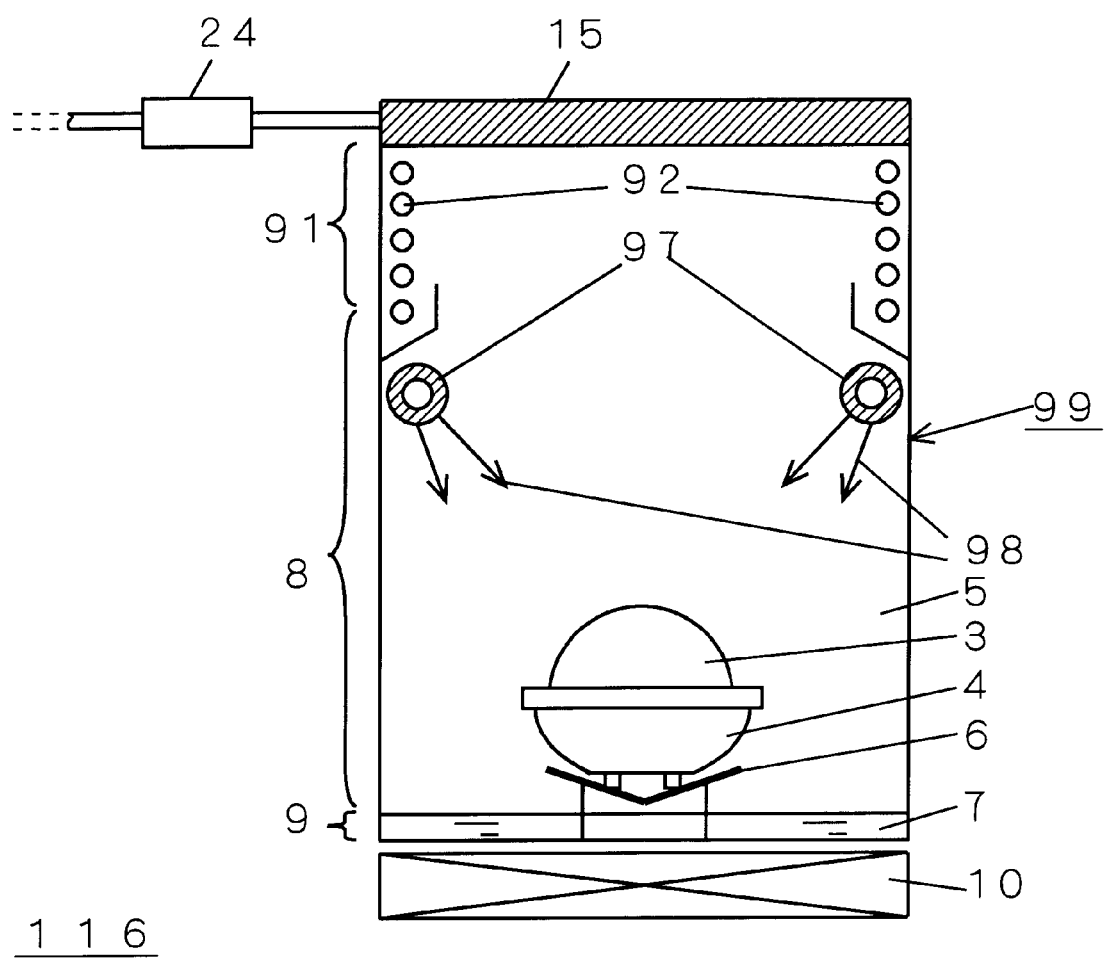
FIG. 24 is a front sectional view showing another example of the apparatus according to the eleventh embodiment.

An advantage gained by exposing the objects to the mist 98 can also be obtained by exposing the objects to the IPA vapor 5 to perform the drying processing without putting the objects into the IPA 7. FIG. 24 is a front sectional view illustrating a drying apparatus having such a structure. A liquid storing section 9 forming a lower portion of a processing vessel 99 of a drying apparatus 116 can store the IPA 7. A pan 6 capable of mounting a cassette 4 is fixed to a bottom portion of the liquid storing section 9. A heater 10 for heating the IPA 7 is provided just below the liquid storing section 9.

A cooling section 91 is provided over a vapor filling section 8. An upper portion of the cooling section 91 is opened such that objects to be processed can be put in and out. Preferably, an opening can freely be covered with a cap 15. A cooling coil 92 is fixed to an inside of the cooling section 91 along an internal wall. In the drying apparatus 116, a refrigerant such as cooling water is fed to the cooling coil 92 so that an IPA vapor 5 can be prevented from diffusing to an outside in the same manner as the drying apparatus 151 according to the prior art. In the drying apparatus 116, the cooling coil 92 and the cap 15 form diffusion preventing means.

A mist spray nozzle 97 is horizontally provided in an upper portion of the vapor filling section 8 adjacently to an internal wall of the vapor filling section 8. For example, the mist spray nozzle 97 sprays a mist 98 of the IPA toward the objects which pass from an opening 22 to the vapor filling section 8, toward those housed in the vapor filling section 8 or toward both of them on receipt of a supply of the IPA from an IPA feeder 38.

Consequently, when inserted into the processing vessel 99 from above through the opening 22 and going from the opening 22 toward the vapor filling section 8, the objects such as semiconductor wafers 3 mounted on the cassette 4 are held in the vapor filling section 8 or exposed to the mist 98 sprayed by the mist spray nozzle 97. In other words, the objects to be processed are exposed to the mist 98 before they are exposed to the IPA vapor 5 filled in the vapor filling section 8 or at the same time that they are exposed to the IPA vapor 5 (or both before and at the same time).

As a result, surfaces of the objects become wet with the IPA very quickly. More specifically, a large amount of the IPA is fed, by the mist 98, to the surfaces of the objects more quickly than condensation of the IPA vapor 5 on the same surfaces. Consequently, an excellent drying processing can be performed without causing uneven dryness. In addition, a time taken for the drying processing can be shortened so that a working efficiency can be increased. Furthermore, a temperature of the IPA 7 heated by the heater 10 can be prevented from being raised high so that safety can be enhanced.

<13. Twelfth Embodiment>

Figure 25:
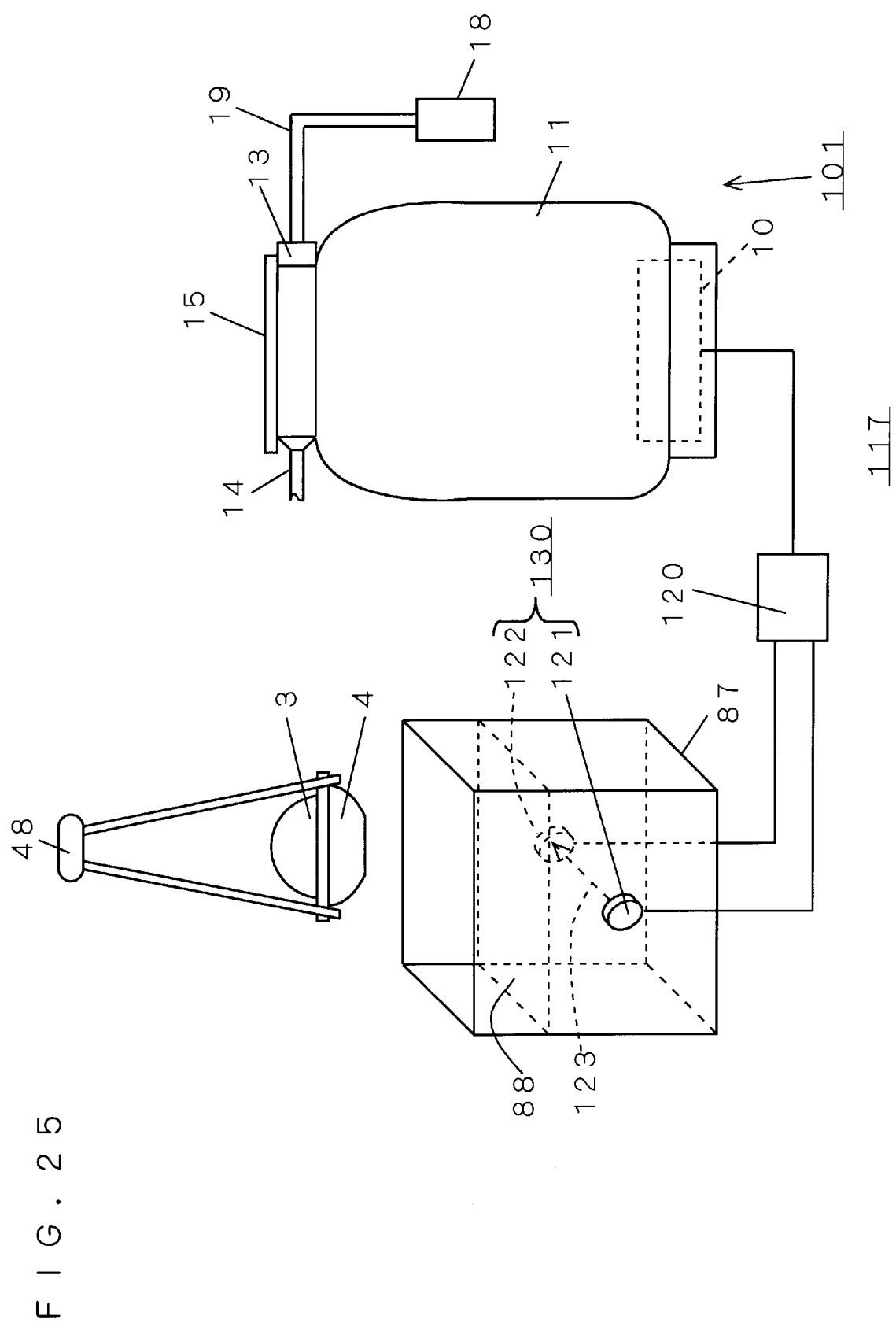
FIG. 25 is a view showing a structure of an apparatus according to a twelfth embodiment.

FIG. 25 is a view showing a structure of a drying apparatus according to a twelfth embodiment. A drying apparatus 117 comprises the drying apparatus 101 (FIG. 1), the processing vessel 87 (FIG. 18) for rinsing provided adjacently to the drying apparatus 101, and a controller 120. Furthermore, a sensor 130 for detecting presence of objects to be processed such as semiconductor wafers 3 is fixed to the processing vessel 87, and the controller 120 receives a detection signal from the sensor 130 and controls an output of a heater 10 on the basis of the detection signal.

For example, the sensor 130 includes an emitter 121 for outputting (i.e. emitting) a beam 123 such as infrared rays, and a receiver 122 for receiving the beam 123. When the objects such as the semiconductor wafers 3 are put into rinsing water 88 stored in the processing vessel 87, the beam 123 is intercepted. Therefore, the receiver 122 can detect the presence of the objects.

When the sensor 130 detects that the objects have been put in, the controller 120 increases the output of the heater 10 and then keeps a high output over a constant period of time, for example. For this reason, when the objects are pulled up from the rinsing water 88 and put into a processing vessel 11, a temperature and a concentration of an IPA vapor can be prevented from being temporarily lowered by heat of the IPA vapor filled in the processing vessel 11 being taken away by the objects. In other words, the output of the heater 10 is controlled by the controller 120 so as to compensate for an amount of the heat of the IPA vapor taken away by the objects.

When the temperature and concentration of the IPA vapor are temporarily lowered, condensation of the IPA vapor on the objects which is started immediately after the objects are put in is then stopped or attenuated. Consequently, the objects are brought into an insufficiently dry state. Thereafter, when the concentration and temperature of the IPA vapor are recovered, the condensation is started again. If a drying processing is temporarily interrupted in this manner, defective dryness is caused.

In the drying apparatus 117, the temperature and concentration of the IPA vapor can be prevented from being lowered. Therefore, it is possible to prevent the defective dryness from being caused by temporarily interrupting the drying processing. In other words, an excellent drying processing can be performed without causing uneven dryness. In addition, a time taken for the drying processing can be shortened so that a working efficiency can be increased.

The time when controller 120 starts to increase the output of the heater 10 does not necessarily coincide with the time when the sensor 130 detects that the objects have been put into the rinsing water 88. For example, control may be performed so as to increase the output of the heater 10 after a constant time set by the sensor 130 so as to correspond to a time for pulling up the objects from the rinsing water 88 or a time for putting the objects into the processing vessel 11. In general, the control should be performed such that the amount of the heat taken away by the objects which are put into the processing vessel 11 can be compensated for. A period in which the output of the heater 10 is kept high can also be set properly to answer this purpose.

<14. Variant>

Figure 26:
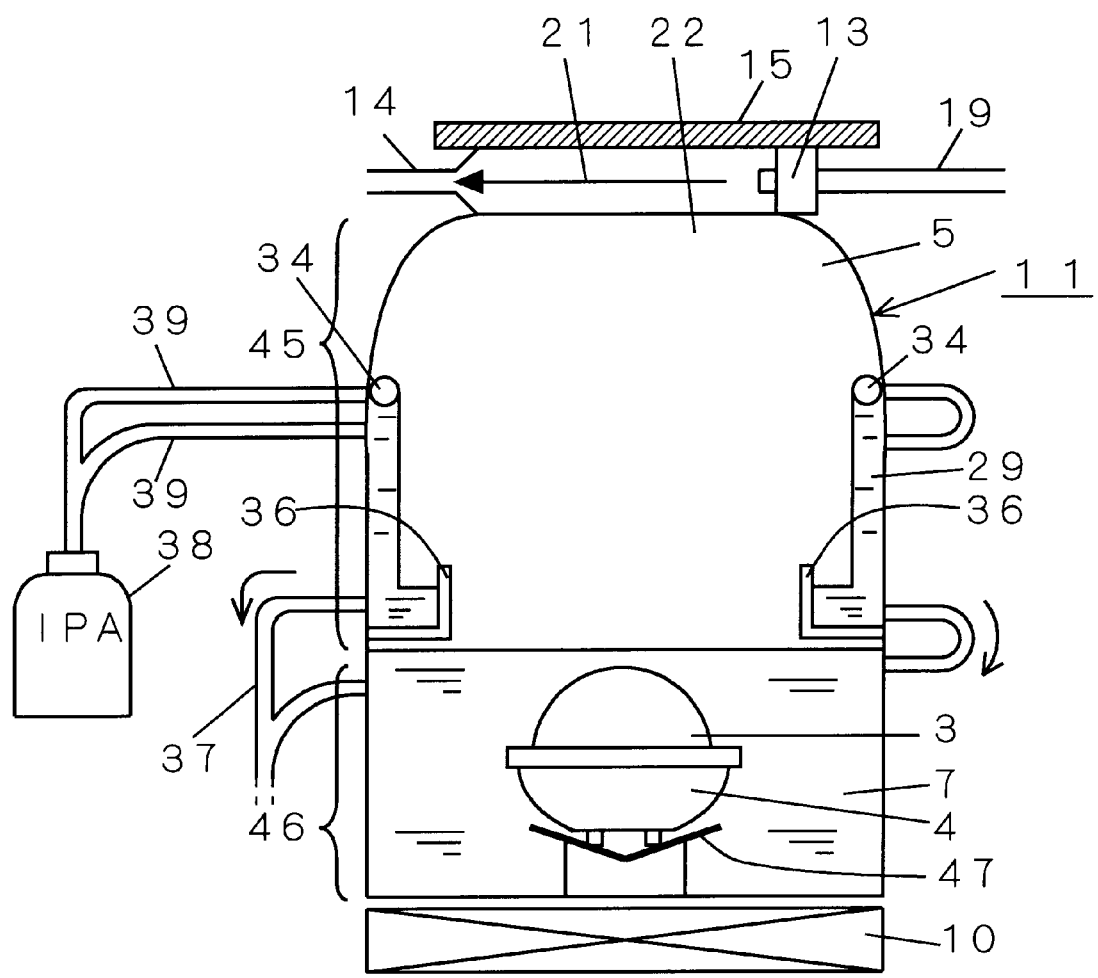
FIG. 26 is a front sectional view showing a variant of the apparatus.

Each of the first to twelfth embodiments described above can appropriately be combined. FIG. 26 shows one of examples. More specifically, a drying apparatus 118 shown in FIG. 26 has such a structure as to cover an internal wall of a vapor filling section 45 with a flow 29 of an IPA in the same manner as in the drying apparatus 101 (FIG. 1) according to the first embodiment. At the same time, the drying apparatus 118 has such a structure that semiconductor wafers 3 and a cassette 4 which are to be processed can be immersed in an IPA 7 stored in a liquid storing section 46 in the same manner as in the drying apparatus 106 (FIG. 8) according to the fourth embodiment.

Also in the drying apparatus 118, the internal wall of the vapor filling section 45 is covered with the flow 29 of the IPA. Therefore, an IPA vapor 5 can be prevented from condensing uselessly on the internal wall of the vapor filling section 45 in the same manner as in the drying apparatus 101. Consequently, a problem of a reduction in a concentration of the IPA vapor 5 can be alleviated. Thus, defective dryness of the objects can be prevented more than in the drying apparatus 106.

While the invention has been described in detail, the foregoing description is in all aspects illustrative and not restrictive. It is understood that numerous other modifications and variations can be devised without departing from the scope of the invention.

We claim:

1. A drying apparatus for drying a surface of an object to be processed by using a water-soluble solvent, comprising:
   a processing vessel defining, on a top, an upward opening through which said object can be put in and out, and capable of storing said solvent in a bottom portion and of housing said object above said stored solvent;
   a heater capable of heating said solvent stored in said bottom portion of said processing vessel;
   a diffusion preventing device for preventing a vapor generated by heating said stored solvent from diffusing from an inside of said processing vessel to an outside thereof through said opening;
   a nozzle for generating a liquid flow of said solvent to cover an inner surface of a side wall of said processing vessel along said inner surface on receipt of a supply of said solvent; and
   a liquid collecting device for collecting said solvent which has flown along said inner surface and leading said solvent to said outside of said processing vessel.

2. The drying apparatus as defined in claim 1, further comprising a circulating device for returning said solvent collected by said liquid collecting device to said nozzle again, thereby cyclically feeding said solvent to said nozzle.

3. The drying apparatus as defined in claim 1, further comprising another heater fixed to an outer surface of said side wall of said processing vessel for heating said flow of said solvent.

4. The drying apparatus as defined in claim 2, wherein said circulating device includes another heater for heating said solvent collected by said liquid collecting device before said solvent is returned to said nozzle.

5. A drying apparatus for drying a surface of an object to be processed by using a water-soluble solvent, comprising:
   a processing vessel defining, on a top, an upward opening through which said object can be put in and out, and capable of storing said solvent in a bottom portion, of immersing said object in said stored solvent, and of housing said object above said stored solvent;
   a heater capable of heating said solvent stored in said bottom portion of said processing vessel;
   a diffusion preventing device for preventing a vapor generated by heating said stored solvent from diffusing from an inside of said processing vessel to an outside thereof through said opening; and
   a reprocessing device for collecting said solvent stored in said bottom portion of said processing vessel, removing water from said collected solvent and returning said solvent to said processing vessel again, thereby cyclically reprocessing said stored solvent.

6. The drying apparatus as defined in claim 5, wherein said reprocessing device includes a separating device for removing said water from said solvent by a separation film for separating said water from said solvent.

7. The drying apparatus as defined in claim 5, wherein said reprocessing device includes a distilling device for distilling said collected solvent to remove said water from said solvent.

8. A drying apparatus for drying a surface of an object to be processed by using a water-soluble solvent, comprising:
   a processing vessel defining, on a top, an upward opening through which said object can be put in and out, and capable of storing said solvent in a bottom portion, of immersing said object in said stored solvent, and of housing said object above said stored solvent;
   a heater capable of heating said solvent stored in said bottom portion of said processing vessel; and
   a diffusion preventing device for preventing a vapor generated by heating said direction solvent from diffusing from an inside of said processing vessel to an outside thereof through said opening,
   wherein said diffusion preventing device includes a spouting device and an exhaust device provided opposite to each other with said opening interposed therebetween,
   said exhaust defines an exhaust port for opening toward said spouting device,
   said spouting device can generate a jet of a gas going toward said exhaust port and covering said opening on receipt of a supply of said gas, said exhaust device can discharge, to an outside, said gas sucked through said exhaust port, and a side wall of said processing vessel has a curved portion which is smoothly curved inward as said opening is approached upward, said drying apparatus further comprising:

a pipe connected to said spouting device;

a nonreactive gas feeding device connected to said spouting device through said pipe for feeding a nonreactive gas to said spouting device; and a cooling device provided on at least a part of said pipe for cooling said nonreactive gas flowing through said pipe.

9. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel; and a diffusion preventing device for preventing a vapor generated by heating said stored solvent from diffusing from an inside of said processing vessel to an outside thereof through said opening, wherein said diffusion preventing device includes a spouting device and an exhaust device provided opposite to each other with said opening interposed therebetween, said exhaust device defines an exhaust port for opening toward said spouting device, said spouting device can generate a jet of a gas going toward said exhaust port and covering said opening on receipt of a supply of said gas, said exhaust device can discharge, to an outside, said gas sucked through said exhaust port, and a side wall of said processing vessel has a curved portion which is smoothly curved inward as said opening is approached upward, said drying apparatus further comprising:

a switching valve having an output coupled to said spouting device for freely selecting one of inputs to communicate with said output;

an ordinary temperature gas feeding device for feeding a nonreactive gas having an ordinary temperature;

a cooled gas feeding device for feeding a cooled nonreactive gas; and a controller for controlling switching operation of said switching valve, wherein said ordinary temperature gas feeding device is connected to one of said inputs, said cooled gas feeding device is connected to another input, and said controller controls said switching valve such that said jet is changed into a jet of said cooled nonreactive gas only when said object is put into said processing vessel across said jet generated by said spouting device.

10. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel;

a diffusion preventing device for preventing a vapor generated by heating said stored solvent from diffusing from an inside of said processing vessel to an outside thereof through said opening; and a cooling device for cooling air above said opening of said processing vessel.

11. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel; and a diffusion preventing device for preventing a vapor generated by heating said stored solvent from diffusing from an inside of said processing vessel to an outside thereof through said opening, wherein said diffusion preventing device includes a cooling device provided in a portion of said processing vessel close to said opening for cooling an inside of said processing vessel in the vicinity of said opening such that said object which is put into said processing vessel through said opening can be cooled, and said cooling device has an electronic thermal element attached to an external wall of said processing vessel.

12. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel;

a diffusion preventing device for preventing a vapor generated by heating said stored solvent from diffusing from an inside of said processing vessel to an outside thereof through said opening; and cooling and rinsing device provided adjacently to said processing vessel, said cooling and rinsing device including:

a rinsing vessel defining, on a top, an upward opening through which said object can be put in and out, and capable of storing rinsing water and of immersing said object in said stored rinsing water; and cooling device fixed to said rinsing vessel for cooling said rinsing water.

13. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel;

a diffusion preventing device for preventing a vapor generated by heating said stored solvent from diffusing from an inside of said processing vessel to an outside thereof through said opening; and a nozzle for spouting a mist of said solvent into said processing vessel on receipt of a supply of said solvent.

14. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel;

a diffusion preventing device for preventing a vapor generated by heating said stored solvent from diffusing from an inside of said processing vessel to an outside thereof through said opening;

a cooling and rinsing device provided adjacently to said processing vessel; and a controller for controlling said heater, said cooling and rinsing device including:

a rinsing vessel defining, on a top, an upward opening through which said object can be put in and out, and capable of storing rinsing water and of immersing said object in said stored rinsing water; and a sensor fixed to said rinsing vessel for detecting presence of said object in said rinsing vessel and for sending a detection signal to said control means, wherein said controller controls an output of said heater so as to compensate, in response to said detection signal, for an amount of heat taken away from said vapor filled in said processing vessel by said object which is transferred from said rinsing vessel into said processing vessel.

15. A drying apparatus for drying a surface of an object to be processed by using a water-soluble solvent, comprising:

a processing vessel defining, on a top, an upward opening through which said object can be put in and out, and capable of storing said solvent in a bottom portion, of immersing said object in said stored solvent, and of housing said object above said stored solvent;

a heater capable of heating said solvent stored in said bottom portion of said processing vessel; and a diffusion preventing device for preventing a vapor generated by heating said stored solvent from diffusing from an inside of said processing vessel to an outside thereof through said opening, wherein said diffusion preventing device includes a spouting device and an exhaust device provided opposite to each other with said opening interposed therebetween, said exhaust device defines an exhaust port for opening toward said spouting device, said spouting device can generate a jet of a gas going toward said exhaust port and covering said opening on receipt of a supply of said gas, said exhaust device can discharge, to an outside, said gas sucked through said exhaust port, and said side wall of said processing vessel has a curved portion which is smoothly curved inward as said opening is approached upward.

\* \* \* \* \*